(12) United States Patent
Meltzer et al.

(10) Patent No.: US 12,380,256 B2
(45) Date of Patent: *Aug. 5, 2025

(54) TECHNIQUES FOR GENERATING SUBJECTIVE STYLE COMPARISON METRICS FOR B-REPS OF 3D CAD OBJECTS

(71) Applicant: AUTODESK, INC., San Francisco, CA (US)

(72) Inventors: Peter Meltzer, London (GB); Amir Hosein Khas Ahmadi, Toronto (CA); Pradeep Kumar Jayaraman, Toronto (CA); Joseph George Lambourne, London (GB); Aditya Sanghi, Toronto (CA); Hooman Shayani, London (GB)

(73) Assignee: AUTODESK, INC., San Francisco, CA (US)

( * ) Notice: Subject to any disclaimer, the term of this patent is extended or adjusted under 35 U.S.C. 154(b) by 41 days.

This patent is subject to a terminal disclaimer.

(21) Appl. No.: 17/523,725

(22) Filed: Nov. 10, 2021

(65) Prior Publication Data

US 2022/0156415 A1    May 19, 2022

Related U.S. Application Data

(60) Provisional application No. 63/113,755, filed on Nov. 13, 2020.

(51) Int. Cl.
*G06F 30/10* (2020.01)
*G06F 30/27* (2020.01)
(Continued)

(52) U.S. Cl.
CPC .............. *G06F 30/10* (2020.01); *G06F 30/27* (2020.01); *G06N 3/045* (2023.01); *G06N 3/088* (2013.01)

(58) Field of Classification Search
CPC ......... G06F 30/10; G06F 30/27; G06N 3/045; G06N 3/088; G06T 7/0002
See application file for complete search history.

(56) References Cited

U.S. PATENT DOCUMENTS 5,982,923 A * 11/1999 Kim .................. G05B 19/4097
382/154
9,922,432 B1 * 3/2018 Risser .................. G06T 11/001
(Continued)

FOREIGN PATENT DOCUMENTS

CN    109863537 A    6/2019

OTHER PUBLICATIONS

Jing, Y., et al. "Neural Style Transfer: A Review" arXiv:1705.04058v7 (2018) (Year: 2018).*

(Continued)

*Primary Examiner* — Jay Hann
(74) *Attorney, Agent, or Firm* — Artegis Law Group, LLP

(57) ABSTRACT

In various embodiments, a style comparison metric application generates a style comparison metric for pairs of different three dimensional (3D) computer-aided design (CAD) objects. In operation, the style comparison metric application executes a trained neural network any number of times to map 3D CAD objects to feature maps. Based on the feature maps, the style comparison metric application computes style signals. The style comparison metric application determines values for weights based on the style signals. The style comparison metric application generates the style comparison metric based on the weights and a parameterized style comparison metric.

20 Claims, 8 Drawing Sheets

(51) Int. Cl.
    *G06N 3/045* (2023.01)
    *G06N 3/088* (2023.01)

(56) References Cited

U.S. PATENT DOCUMENTS

| | | | |
|---|---|---|---|
| 10,114,995 B2 | 10/2018 | Friman | |
| 10,318,889 B2* | 6/2019 | Xu | G06F 18/214 |
| 10,397,524 B1 | 8/2019 | Wu | |
| 10,467,820 B2* | 11/2019 | Mordvintsev | G06T 19/20 |
| 10,535,164 B2* | 1/2020 | Shlens | G06N 3/08 |
| 11,440,196 B1 | 9/2022 | Kirmani et al. | |
| 11,620,330 B2* | 4/2023 | Tomar | G06N 3/045 |
| | | | 382/224 |
| 11,704,802 B2* | 7/2023 | Abhinav | G06T 19/20 |
| | | | 382/103 |
| 2003/0080957 A1 | 5/2003 | Stewart et al. | |
| 2007/0055401 A1 | 3/2007 | Van et al. | |
| 2007/0183669 A1 | 8/2007 | Owechko et al. | |
| 2009/0259440 A1 | 10/2009 | Reed et al. | |
| 2012/0296609 A1 | 11/2012 | Khan et al. | |
| 2014/0168424 A1 | 6/2014 | Attar et al. | |
| 2017/0103584 A1 | 4/2017 | Vats | |
| 2017/0116771 A1 | 4/2017 | Zeng | |
| 2017/0161590 A1 | 6/2017 | Boulkenafed et al. | |
| 2018/0164434 A1 | 6/2018 | Stokes et al. | |
| 2019/0164055 A1* | 5/2019 | Ljung Larhed | G06N 3/08 |
| 2020/0050901 A1 | 2/2020 | Kirchner | |
| 2020/0134778 A1 | 4/2020 | He et al. | |
| 2020/0134909 A1 | 4/2020 | Davies et al. | |
| 2020/0184119 A1 | 6/2020 | Machalica | |
| 2020/0219328 A1 | 7/2020 | Yau et al. | |
| 2020/0250540 A1 | 8/2020 | Mehr | |
| 2022/0076374 A1* | 3/2022 | Li | G06T 3/0056 |
| 2024/0095413 A1 | 3/2024 | Kulkarni et al. | |

OTHER PUBLICATIONS

Xiang, S. & Li, H. "Anime Style Space Exploration Using Metric Learning and Generative Adversarial Networks" arXiv:1805.07997v1 (2018) (Year: 2018).*
Friedrich, T. & Menzel, S. "Standardization of Gram Matrix for Improved 3D Neural Style Transfer" IEEE Symp. Series on Computational Intelligence, pp. 1375-1382 (2019) (Year: 2019).*
Gairola, S., et al. "Unsupervised Image Style Embeddings for Retrieval and Recognition Tasks" IEEE CVF Winter Conference on Applications of Computer Vision (Mar. 2020) (Year: 2020).*
Ansaldi, S., et al. "Geometric Modeling of Solid Objects by Using a Face Adjacency Graph Representation" SIGGRAPH'85, vol. 19, No. 3, pp. 131-139 (1985) (Year: 1985).*
Extended European Search Report for Application No. 21207987.5 dated Apr. 20, 2022.
Meltzer et al., "test_classifier.py", URL:https://github.com/AutodeskAILab/UVStyle-Net/blob/2d663e723cb1Oc74f0966819f4ba566ba0904a2d/test_classifier. py, Github/AutodeskAILab, Oct. 21, 2020, 4 pages.
Meltzer et al., "UVStyle-Net: Unsupervised Few-shot Learning of 3D Style Similarity Measure for B-Reps", Arxiv.Org, Cornell University Library, XP091065922, Oct. 11, 2021, 13 pages.
Ahmed et al., "A survey on Deep Learning Advances on Different 3D Data Representations", vol. 1, No. 1, Apr. 2019, 35 pages.
Alain et al., "Understanding Intermediate Layers Using Linear Classifier Probes", arXiv:1610.01644, NIPS, 2016, 9 pages.
Azadi et al., "Multi-Content GAN for Few-Shot Font Style Transfer", CVPR, 2018, pp. 7564-7573.
Babaeizadeh et al., "Adjustable Real-time Style Transfer", arXiv:1811.08560, 2018, 14 pages.
Bronstein et al., "Geometric Deep Learning: Going Beyond Euclidean Data", arXiv:1611.08097, IEEE, 2017, 22 pages.
Cao et al., "PSNet: A Style Transfer Network for Point Cloud Stylization on Geometry and Color", IEEE, 2020, pp. 3326-3334.
Cao et al., "3D Object Classification via Spherical Projections", arXiv:1712.04426, In 2017 International Conference on 3D Vision (3DV), 2017, 9 pages.
Chang et al., "ShapeNet: An Information Rich 3D Model Repository", arXiv:1512.03012, 2015, 11 pages.
Cohen et al., "EMNIST: An Extension to MNIST to Handwritten Letters", arXiv:1702.05373, 2017, 10 pages.
Haan et al., "Gauge Equivariant Mesh CNNs Anisotropic Convolutions on Geometric Graphs", arXiv:2003.05425, ICLR, 2021, 24 pages.
Gatys et al., "Image Style Transfer Using Convolutional Neutral Networks", CVPR, 2016, pp. 2414-2423.
Griffiths et al., "A Review on Deep Learning Techniques for 3D Sensed Data Classification", arXiv:1907.04444, Jul. 11, 2019, 25 pages.
Guo et al., "Deep Learning for 3D Point Clouds: A Survey", arXiv:1912.12033, IEEE, 2020, 27 pages.
Hanocka et al., "MeshCNN: A Network with an Edge", ACM Transactions on Graphics, vol. 38, No. 4, Article 90, https://doi.org/10.1145/3306346.3322959, Jul. 2019, pp. 90:1-90:12.
Huang et al., "Arbitrary Style Transfer in Real-Time Adaptive Instance Normalization", arXiv:1703.06868, 2017, 11 pages.
Jayaraman et al., "UV-Net: Learning from Curve-Networks Solids" arXiv:2006.10211, 2020, 15 pages.
Jiang et al., "Tsit: A Simple and Versatile Framework for Image-to-Image Translation", arXiv:2007.12072, 2020, 25 pages.
Karras et al., "A Style-Based Generator Architecture for Generative Adversarial Networks", CVPR, 2018, pp. 4401-4410.
Karras et al., "Analyzing and Improving the Image Quality of StyleGAN", arXiv:1912.04958, 2019, 21 pages.
Koch et al., "ABC: A Big CAD Model Dataset for Geometric Deep Learning", CVPR, 2019, pp. 9601-9611.
Lim et al., "Identifying Style of 3D Shapes Using Deep Metric Learning", Eurographics Symposium on Geometry Processing, vol. 35, No. 5, 2016, 9 pages.
Liu et al., "Neutral Subdivision", ACM Transactions on Graphics, vol. 39, No. 4, Article 1, arXiv:2005.01819, Jul. 2020, pp. 1:1-1:16.
Liu et al., "Style Compatibility for 3D Furniture Models", ACM Transactions on Graphics, vol. 34, No. 4, Article 85, Aug. 2015, pp. 85:1-85:9.
Lun et al., "Elements of Style: Learning Perceptual Shape Style Similarity", 2015, 14 pages.
Pan et al., "Deep Model Style: Cross-class Style Compatibility for 3D Furniture within a Scene", IEEE International Conference on Big Data, 2017, pp. 4307-4313.
Pan et al., "3D Patch-Based Sparse Learning for Style Feature Extraction", vol. 7, 2019, pp. 172403-172412.
Park et al., "Swapping Autoencoder for Deep Image Manipulation", arXiv:2007.00653, 2020, 23 pages.
Polanía et al., "Learning Future Compatibility with Graph Neural Networks", arXiv:2004.07268, 2020, pp. 4321-4329.
Qi et al., "PointNet: Deep Learning on Point Sets for 3D Classification and Segmentation", IEEE Computer Society, 10.1109/CVPR.2017.16, 2017, pp. 77-85.
Qi et al., "PointNet++: Deep Hierarchical Feature Learning on Point Sets in a Metric Space", NIPS, 2017, 10 pages.
Segu et al., "3DSNet: Unsupervised Shape-to-Shape 3D Style Transfer", arXiv:2011.13388, 2020, 15 pages.
Su et al., "Multi-view Convolutional Neural Networks for 3D Shape Recognition", Computer Vision Foundation, ICCV, 2015, pp. 945-953.
Ulyanov et al., "Improved Texture Networks: Maximizing Quality and Diversity in Feed-forward Stylization and Texture Synthesis", IEEE Computer Society, 10.1109/CVPR.2017.437, 2017, pp. 4105-4113.
Virtanen et al., "SciPy 1.0: Fundamental Algorithms for Scientific Computing in Python", Nature Methods, DOI 10.1038/s41592-019-0686-2, 2020, 15 pages.
Wang et al., "Dynamic Graph CNN for Learning on Point Clouds", ACM Transactions on Graphics, vol. 38, No. 5, Article 146, Oct. 2019, pp. 146:1-146:12.
Xu et al., "How Powerful are Graph Neural Networks?", arXiv:1810.00826, ICLR, 2019, 17 pages.

(56) References Cited

OTHER PUBLICATIONS

Zhang et al., "Multimodal Style Transfer via Graph Cuts", ICCV, 2019, pp. 5943-5951.
Wu et al., "3D ShapeNets: A Deep Representation for Volumetric Shapes", IEEE, 2015, pp. 1912-1920.
Jayaraman et al., "UV-Net: Learning from Boundary Representations", arXiv:2006.10211, 2021, 18 pages.
Non Final Office Action received for U.S. Appl. No. 17/523,749 dated Jan. 6, 2025, 58 pages.
Non Final Office Action received for U.S. Appl. No. 17/523,746 dated Jan. 24, 2025, 26 pages.
Kuljic et al., "Determining Distance and Shape of an Object by 2D Image Edge Detection and Distance Measuring Sensor", 6th International Symposium on Intelligent Systems and Informatics, DOI: 10.1109/SISY.2008.4664922, Sep. 26-27, 2008, 4 pages.
Heimann et al., "3D Active Shape Models Using Gradient Descent Optimization of Description Length", In Biennial International Conference on Information Processing in Medical Imaging, 2005, 12 pages.
Final Office Action received for U.S. Appl. No. 17/523,749 dated May 15, 2025, 48 pages.
Final Office Action received for U.S. Appl. No. 17/523,746 dated Jun. 25, 2025, 62 pages.

* cited by examiner

```
                                                         ← 800

┌─────────────────────────────────────────────────────────────┐
│ Receive a command to compute gradient(s) of a style          │
│ comparison metric for two 3D CAD objects with respect to     │
│ at least the first 3D CAD object                             │
│ 802                                                          │
└─────────────────────────────────────────────────────────────┘
                              ↓
┌─────────────────────────────────────────────────────────────┐
│ Use a trained 3D CAD object NN that is associated with the   │
│ style comparison metric to generate a set of feature maps    │
│ corresponding to samples of the first 3D CAD object          │
│ 804                                                          │
└─────────────────────────────────────────────────────────────┘
                              ↓
┌─────────────────────────────────────────────────────────────┐
│ Use the trained 3D CAD object NN to generate a set of        │
│ feature maps corresponding to samples of the second 3D CAD   │
│ object                                                       │
│ 806                                                          │
└─────────────────────────────────────────────────────────────┘
                              ↓
┌─────────────────────────────────────────────────────────────┐
│ For each feature map, perform one or more per-face           │
│ recentering operations or one or more instance normalization │
│ operations on the feature map to generate a normalized       │
│ feature map                                                  │
│ 808                                                          │
└─────────────────────────────────────────────────────────────┘
                              ↓
┌─────────────────────────────────────────────────────────────┐
│ For each normalized feature map, extract the normalized,     │
│ flattened upper triangle of the Gram matrix for the          │
│ normalized feature map to generate a corresponding style     │
│ signal                                                       │
│ 810                                                          │
└─────────────────────────────────────────────────────────────┘
                              ↓
┌─────────────────────────────────────────────────────────────┐
│ Compute the partial derivative of the style comparison       │
│ metric with respect to the absolute position of each         │
│ unmasked sample of the first 3D CAD object to generate a     │
│ first style gradient                                         │
│ 812                                                          │
└─────────────────────────────────────────────────────────────┘
                              ↓
┌─────────────────────────────────────────────────────────────┐
│ Optionally, compute the partial derivative of the style      │
│ comparison metric with respect to the absolute position of   │
│ each unmasked sample of the second 3D CAD object to          │
│ generate a second style gradient                             │
│ 814                                                          │
└─────────────────────────────────────────────────────────────┘
                              ↓
┌─────────────────────────────────────────────────────────────┐
│ Update a GUI to display a visualization of the first style   │
│ gradient with respect to the first 3D CAD object and         │
│ optionally display a visualization of the second style       │
│ gradient with respect to the second 3D CAD object            │
│ 816                                                          │
└─────────────────────────────────────────────────────────────┘
```

FIGURE 8

TECHNIQUES FOR GENERATING SUBJECTIVE STYLE COMPARISON METRICS FOR B-REPS OF 3D CAD OBJECTS

CROSS-REFERENCE TO RELATED APPLICATIONS

This application claims priority benefit of the U.S. Provisional Patent Application titled, "UNSUPERVISED FEW-SHOT LEARNING OF THREE-DIMENSIONAL STYLE SIMILARITY MEASURE FOR B-REPS," filed on Nov. 13, 2020 and having Ser. No. 63/113,755. The subject matter of this related application is hereby incorporated herein by reference.

BACKGROUND

Field of the Various Embodiments

Embodiments of the present invention relate generally to computer science and computer-aided design software and, more specifically, to techniques for generating subjective style comparison metrics for B-reps of 3D CAD objects.

Description of the Related Art

In the context of three-dimensional ("3D") mechanical design, computer-aided design ("CAD") tools are oftentimes used to streamline the process of generating, analyzing, modifying, optimizing, displaying, and/or documenting designs for the different 3D objects making up an overarching mechanical design. A particularly useful feature of CAD tools is that these tools can be used to automatically compare the computational representations of various 3D CAD objects based on certain metrics. One such metric is a style comparison metric that quantifies the similarity or the dissimilarity in geometric style between a pair of different 3D objects independently of the underlying substantive content of the two 3D objects.

In one approach to instituting a style comparison metric, a training set of 3D meshes or 3D point clouds representing different 3D objects are labeled for style by numerous individuals (e.g., via crowd-sourcing). Supervised learning techniques are then used to train a machine learning model to estimate a style difference or "style distance" between pairs of different 3D objects that are represented by the labeled training set. The resulting trained style model can subsequently be used to estimate the style distance between pairs of different 3D objects that are represented by pairs of different 3D meshes or different 3D point clouds.

One drawback of the above approach is that the machine learning model typically learns only a general style comparison metric that does not account for different perceptions of style between different individual users. To institute an individualized style comparison metric using supervised learning would require training a machine learning model based on a relatively large training set labeled for style based on a single user. Because individually labeling a relatively large training set is prohibitively time-consuming, supervised learning techniques are rarely, if ever, used to generate style comparison metrics that reflect the preferences of individual users. Another drawback of the above approach is that 3D meshes and 3D point clouds frequently lose fidelity when used to represent stylistic details, which can reduce the accuracy of a resulting trained style model.

In contrast to 3D meshes and 3D point clouds, boundary-representations ("B-reps") of 3D objects are characterized by a high degree of fidelity when used to represent stylistic details. Accordingly, B-reps have become an industry standard in 3D both computer-aided design and computer-aided manufacturing. However, because the number of B-reps that are labeled for style is relatively small, applying supervised learning techniques to B-reps in the context of a style comparison metric is impractical.

As the foregoing illustrates, what is needed in the art are more effective techniques for generating style comparison metrics for pairs of different 3D objects when using computer-aided design tools.

SUMMARY

One embodiment of the present invention sets forth a computer-implemented method for generating a style comparison metric for pairs of different three dimensional (3D) computer-aided design (CAD) objects. The method includes executing a trained neural network one or more times to map a plurality of 3D CAD objects to a set of feature maps; computing a set of style signals based on the set of feature maps; determining a set of values for a set of weights based on the set of style signals; and generating the style comparison metric based on the set of weights and a parameterized style comparison metric.

At least one technical advantage of the disclosed techniques relative to the prior art is that the disclosed techniques implement a few-shot learning approach to generate an effective individualized style comparison metric for pairs of different 3D CAD objects. In that regard, with the disclosed techniques, the relative importance of different terms in a parameterized style comparison metric to geometric style, as perceived by an individual user, can be learned using as few as two user-specified examples of 3D CAD objects having similar styles. Further, the terms in the parameterized style comparison metric can be derived from data generated by a neural network that is trained to process B-reps using unsupervised techniques, which do not require labeled training data. Accordingly, unlike prior-art approaches, the disclosed techniques can be used to compare the geometric styles of pairs of different 3D CAD objects represented by B-reps, thereby increasing the accuracy of geometric style comparisons relative to the prior art. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

FIG. 8 is a flow diagram of method steps for generating one or more visualizations of at least one geometric style gradient for a pair of different 3D CAD objects, according to various embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details. For explanatory purposes, multiple instances of like objects are denoted with reference numbers identifying the object and parenthetical numbers identifying the instance where needed.

System Overview

Figure 1:
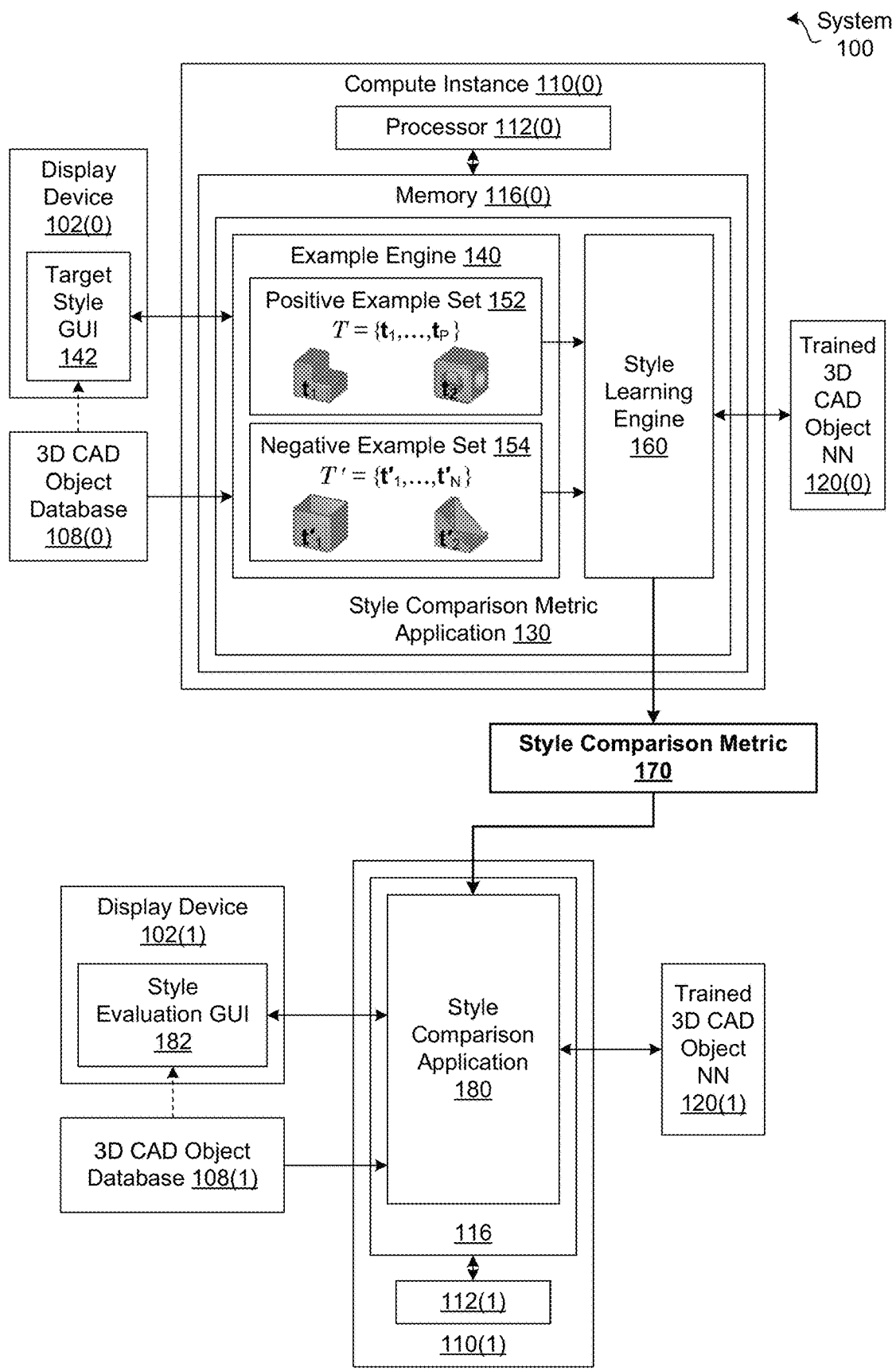
FIG. 1 is a conceptual illustration of a system configured to implement one or more aspects of the various embodiments.

FIG. 1 is a conceptual illustration of a system 100 configured to implement one or more aspects of the various embodiments. As shown, the system 100 includes, without limitation, a compute instance 110(0), a compute instance 110(1), a display device 102(0), a display device 102(1), a 3D CAD object database 108(0), a 3D CAD object database 108(1), a trained 3D CAD object neural network (NN) 120(0), and a trained 3D CAD object NN 120(1). For explanatory purposes, the compute instance 110(0) and the compute instance 110(1) are also referred to herein individually as "compute instance 110" and collectively as "the compute instances 110."

In some embodiments, the system 100 can include, without limitation, any number of compute instances 110. In the same or other embodiments, the system 100 can omit display device 102(0), display device 102(1), 3D CAD object database 108(0), 3D CAD object database 108(1), either the trained 3D CAD object NN 120(0) or the trained 3D CAD object NN 120(1), or any combination thereof. In some embodiments, the system 100 can include one or more other display devices, one or more other 3D CAD object databases, one or more other trained 3D CAD object NNs, or any combination thereof. In some embodiments, the 3D CAD object database 108(0) and/or the 3D CAD object database 108(1) can be replaced or supplemented with any number of data sets.

In various embodiments, any number of the components of the system 100 can be distributed across multiple geographic locations or implemented in one or more cloud computing environments (i.e., encapsulated shared resources, software, data, etc.) in any combination.

As also shown, the compute instance 110(0) includes, without limitation, a processor 112(0) and a memory 116(0). As also shown, the compute instance 110(1) includes, without limitation, a processor 112(1) and a memory 116(1). For explanatory purposes, the processor 112(0) and the processor 112(1) are also referred to herein individually as "the processor 112" and collectively as "the processors 112." For explanatory purposes, the memory 116(0) and the memory 116(1) are also referred to herein individually as "the memory 116" and collectively as "the processors 116."

Each processor 112 can be any instruction execution system, apparatus, or device capable of executing instructions. For example, each processor 112 could comprise a central processing unit (CPU), a graphics processing unit (GPU), a controller, a microcontroller, a state machine, or any combination thereof. The memory 116 of each compute instance 110 stores content, such as software applications and data, for use by the processor 112 of the compute instance 110. In some alternative embodiments, each compute instance 110 can include any number of processors 112 and any number of memories 116 in any combination. In particular, any number of compute instances 110 (including one) can provide any number of multiprocessing environments in any technically feasible fashion.

Each memory 116 can be one or more of a readily available memory, such as random access memory, read-only memory, floppy disk, hard disk, or any other form of digital storage, local or remote. In some embodiments, a storage (not shown) may supplement or replace any number of memories 116. The storage can include any number and type of external memories that are accessible to any number of processors 112. For example, and without limitation, the storage may include a Secure Digital Card, an external Flash memory, a portable compact disc read-only memory, an optical storage device, a magnetic storage device, or any suitable combination of the foregoing.

Each compute instance 110 is configured to implement one or more software applications. For explanatory purposes only, each software application is depicted as residing in the memory 116 of a single compute instance 110 and executing on a processor 112 of the single compute instance 110. However, as persons skilled in the art will recognize, the functionality of each software application can be distributed across any number of other software applications that reside in the memories 116 of any number of compute instances 110 and execute on the processors 112 of any number of compute instances 110 in any combination. Further, the functionality of any number of software applications can be consolidated into a single application or subsystem.

In particular, the compute instance 110(0) is configured to generate a style comparison metric 170 that quantifies the similarity or the dissimilarity in geometric style between a pair of different 3D CAD objects independently of the underlying substantive content of the two 3D CAD objects. In a complementary fashion, the compute instance 110(1) automatically compares and/or evaluates 3D CAD objects based on the style comparison metric 170.

As described previously herein, in a conventional approach to implementing a style comparison metric, supervised learning techniques are used to train a machine learning model based on labeled 3D meshes or 3D point clouds. One drawback of such an approach is that the machine learning model typically learns only a general style comparison metric that does not account for different perceptions of style between different individual users. Another drawback of such an approach is that 3D meshes and 3D point clouds frequently lack fidelity when representing stylistic details and therefore the accuracy of the trained style model can be reduced. In contrast to 3D meshes and 3D point clouds, B-reps of 3D objects are characterized by a high degree of fidelity when representing stylistic details. However, because the number of B-reps that are labeled for style is relatively small, using supervised learning techniques to train a machine learning model to institute a style comparison metric based on B-reps is impractical.

Generating Subjective Style Comparison Metrics

To address the above limitations, the system 100 includes, without limitation, a style comparison metric application 130 and a style comparison application 180. In some embodiments, the style comparison metric application 130 executes the trained 3D CAD object neural network 120(0) to map 3D CAD objects to feature maps sets, extracts style signals from the feature maps sets, and implements few-shot learning techniques to learn the relative importance of the style signals to a user. Using few-shot learning techniques, the relative importance of the style signals to a user can be accurately determined based on as few as two user-specified examples of 3D CAD objects having similar styles.

As shown, in some embodiments, the style comparison metric application 130 resides in the memory 116(0) of compute instance 110(0) and executes on the processor 112(0) of the compute instance 110(0). In the same or other embodiments, the style comparison metric application 130 includes, without limitation, an example engine 140 and style learning engine 160. The example engine 140 generates, without limitation, a positive example set 152 and a negative example set 154.

As shown, the positive example set 152 is denoted herein as T. In some embodiments, the positive example set 152 includes, without limitation, a set of P 3D CAD objects, where the set is denoted as $\{t_1, \ldots, t_P\}$, $t_1$-$t_P$ are examples of a target style, and P can be any integer $\geq 2$. Each of the P 3D CAD objects can be represented in any technically feasible fashion. For instance, in some embodiments, each 3D CAD object is a B-rep. In some other embodiments, each 3D CAD object is a 3D mesh. In some other embodiments, each 3D CAD object is a 3D point cloud. A representation of a 3D CAD object is also referred to herein as a 3D CAD object. For explanatory purposes, FIG. 1 depicts two 3D CAD objects (denoted $t_1$ and $t_2$) that are in the positive example set 152. As shown, the content of the two 3D CAD objects $t_1$ and $t_2$ is different but some stylistic aspects are shared between $t_1$ and $t_2$.

In some embodiments, the negative example set 154 is denoted herein as T'. As shown, in some embodiments, the negative example set 154 includes, without limitation, a set of N 3D CAD objects, where the set is denoted as $\{t'_1, \ldots, t'_N\}$, $t'_1$-$t'_N$ are counter-examples of the target style, and N can be any integer $\geq 2$. In some other embodiments, the negative example set includes, without limitation, a single 3D CAD object ($t'_1$). In some other embodiments, the negative example set 154 can be an empty set. For explanatory purposes, FIG. 1 depicts two 3D CAD objects (denoted and $t'_2$) that are in the negative example set 154.

As shown, in some embodiments, the style comparison metric application 130 generates a target style graphical user interface (GUI) 142. The target style GUI 142 enables users to specify, review, and/or modify positive examples and negative examples of a target style in any technically feasible fashion. As shown, in some embodiments, the style comparison metric application 130 facilitates user-selection of positive examples and negative examples from the 3D CAD object database 108(0). The 3D CAD object database 108(0) can include, without limitation, any number of 3D CAD objects that are represented in any technically feasible fashion.

As shown, in some embodiments, the style comparison metric application 130 displays the target style GUI 142 on the display device 102(0). The display device 102(0) can be any type of device that can be configured to display any amount and/or type of visual content in any technically feasible fashion. In the same or other embodiments, the compute instance 110(0), zero or more other compute instances, the display device 102(0), and zero or more other display devices are integrated into a user device (not shown). Some examples of user devices include, without limitation, desktop computers, laptops, smartphones, smart televisions, game consoles, tablets, etc.

In some embodiments, each of the 3D CAD objects in the positive example set 152 is selected by a user (e.g., via the target style GUI). In the same or other embodiments, zero or more of the 3D CAD objects in the negative example set 154 are selected by a user and zero or more of the 3D CAD objects in the negative example set 154 are automatically selected by the example engine 140. The example engine 140 can select and add any number of negative examples to the negative example set 154 in any technically feasible fashion. For instance, in some embodiments, to reduce the risk of over-fitting during few-shot learning, the example engine 140 randomly selects a relatively large number of 3D CAD objects from the 3D CAD object database 108(0) and adds the selected 3D CAD objects to the negative example set 154.

The style learning engine 160 generates the style comparison metric 170 using the trained 3D CAD object neural network 120(0) based on the positive example set 152 and the negative example set 154. The trained 3D CAD object neural network 120(0) can be any type of neural network that processes any type of representation of 3D CAD objects. For instance, in some embodiments, the trained 3D CAD object neural network 120(0) is a trained B-rep encoder, a trained 3D mesh classifier, a trained UV-net encoder, a trained 3D point cloud classifier, a trained B-pre classifier, a trained 3D mesh encoder, or any other similar type of encoder or classifier.

As described in greater detail below in conjunction with FIGS. 2 and 3, in some embodiments, the style learning engine 160 executes the trained 3D CAD object neural network 120(0) to map 3D CAD objects to feature map sets. Notably, each feature map set includes multiple feature maps, where each feature map is associated with a different layer of the trained 3D CAD object neural network. In some embodiments, the style learning engine 160 adds an input feature map to each feature map set. In the same or other embodiments, for each feature map, the style learning engine 160 extracts a different style signal from second-order activation information (e.g., statistics) and/or second-order feature information represented in the feature map. The style learning engine 160 then implements few-shot learning techniques based on the positive example set 152 and the negative example set 154 to learn the relative importance of the style signals to a user. The style learning engine 160 generates the style comparison metric 170 based on the relative importance of the style signals to the user.

The style comparison metric 170 can be any type of measurement technique that can be used to quantify the similarity or dissimilarity in geometric style between two 3D CAD objects or a "pair of 3D CAD objects." For instance, in some embodiments, the style comparison metric 170 is an equation that quantifies the difference or "distance" between the geometric styles of two 3D CAD objects. In some other embodiments, the style comparison metric 170 can be any other type of technique for quantifying the dissimilarity in geometric style between two 3D CAD objects, such as a loss function. In yet other embodiments, the style comparison metric 170 can be any type of technique for quantifying the similarity in geometric between two 3D CAD objects, such as a similarity metric. The techniques described herein can be modified to reflect any number and/or types of style comparison metrics.

As shown, in some embodiments, the style comparison application 180 resides in the memory 116(1) of compute instance 110(1) and executes on the processor 112(1) of the compute instance 110(1). The style comparison application 180 can perform any number and/or types of operations to automatically evaluate styles of any number of 3D CAD objects based on applying the style comparison metric 170 to pairs of 3D CAD objects. Although not shown, in some embodiments, different instances of the style comparison application 180 can compare the same or different 3D CAD objects based on different style comparison metrics. In the same or other embodiments, different style comparison metrics can reflect different perceptions of style.

The style comparison application 180 can determine the 3D CAD objects to evaluate and the number and/or types of evaluations to perform in any technically feasible fashion. As shown, in some embodiments, the style comparison application 180 generates the style evaluation GUI 182 that enables users to specify any number and/or types of evaluations that are to be performed in any technically feasible fashion. In some embodiments, the style evaluation GUI 182 enables users to select any number of 3D CAD objects from the 3D CAD object database 108(1) for display and/or evaluation. The 3D CAD object database 108(1) can include, without limitation, any number of 3D CAD objects that are represented in any technically feasible fashion. In the same or other embodiments, the style evaluation GUI 182 enables the style comparison application 180 to display any number and/or types of evaluation results in any technically feasible fashion.

As shown, in some embodiments, the style comparison application 180 displays the style evaluation GUI 182 on the display device 102(1). The display device 102(1) can be any type of device that can be configured to display any amount and/or type of visual content in any technically feasible fashion. In the same or other embodiments, the compute instance 110(1), zero or more other compute instances, the display device 102(1), and zero or more other display devices are integrated into a user device (not shown). Some examples of user devices include, without limitation, desktop computers, laptops, smartphones, smart televisions, game consoles, tablets, etc.

As described in greater detail below in conjunction with FIGS. 3-5, in some embodiments, to compare the geometric styles of a pair of 3D CAD objects, the style comparison application 180 executes the trained 3D CAD object neural network 120(1) to map the pair of 3D CAD objects to feature map sets. In some embodiments, the trained 3D CAD object neural network 120(0) and the trained 3D CAD object neural network 120(1) are different instances of the same trained 3D CAD object neural network. In some embodiments, the style comparison application 180 adds an input feature map to each feature map set. In the same or other embodiments, for each feature map, the style comparison application 180 extracts a different style signal from second-order activation information (e.g., statistics) and/or second-order feature information represented in the feature map. The style comparison application 180 then computes a metric value for the style comparison metric based on the style signals. The metric value quantifies a similarity or a dissimilarity in geometric style between the pair of 3D objects.

The style comparison application 180 can perform any number and/or type of evaluation-related operations on any number of metric values to determine and/or display any number and/or types of evaluation results. For instance, in some embodiments, the style comparison application 180 can perform any number and/or types of ranking operations, statistical operations, filtering operations, any other type of mathematical operations, plotting operations, any other type of graphical operations, or any combination thereof on any number of the metric values 440 and optionally any number of previously generated metric values to generate any number and/or types of evaluation results (not shown).

As described in greater detail below in conjunction with FIG. 5, in some embodiments, the style comparison application 180 includes, without limitation, a gradient engine (not shown in FIG. 1) that computes any number of style gradients and displays any number of visualizations for any number and/or types of style comparison metrics corresponding to any number and/or types of trained 3D CAD object neural networks and any number of pairs of 3D CAD objects. Notably, in some embodiments, the direction of the vectors included in a gradient between a pair of 3D CAD objects indicate the directions in which corresponding sample points could be moved in the geometry domain to increase the similarity of the geometric styles of the pair of 3D CAD objects.

It will be appreciated that the system shown herein is illustrative and that variations and modifications are possible. The connection topology, including the location and arrangement of the style comparison metric application 130, the example engine 140, the style learning engine 160, the target style GUI 142, the display device 102(0), the 3D CAD object database 108(0), the trained 3D CAD object neural network 120(0), the style comparison application 180, the display device 102(1), the 3D CAD object database 108(1), and the trained 3D CAD object neural network 120(1), or any combination thereof can be modified as desired.

In some embodiments, one or more components shown in FIG. 1 may not be present. In the same or other embodiments, the functionality of the style comparison metric application 130, the example engine 140, the style learning engine 160, the trained 3D CAD object neural network 120(0), the style comparison application 180, the trained 3D CAD object neural network 120(1), or any combination thereof can be distributed across any number of other software applications and components that may or may not be included in the system 100.

Note that the techniques described herein are illustrative rather than restrictive, and can be altered without departing from the broader spirit and scope of the invention. Many modifications and variations will be apparent to those of ordinary skill in the art without departing from the scope and spirit of the described embodiments and techniques. Further, in various embodiments, any number of the techniques disclosed herein may be implemented while other techniques may be omitted in any technically feasible fashion.

For explanatory purposes, in the embodiments depicted in FIGS. 2-5, the style comparison metric 170 is a style distance metric that quantifies the dissimilarity in geometric style or "style distance" between two 3D CAD objects. In some other embodiments, the style comparison metric 170 can be any other type of technique for quantifying the dissimilarity in geometric style between two 3D CAD objects, such as a loss function. In yet other embodiments, the style comparison metric 170 can be any type of technique for quantifying the similarity in geometric between two 3D CAD objects, such as a similarity metric. The techniques described herein can be modified to reflect any type of style comparison metric 170.

Figure 2:
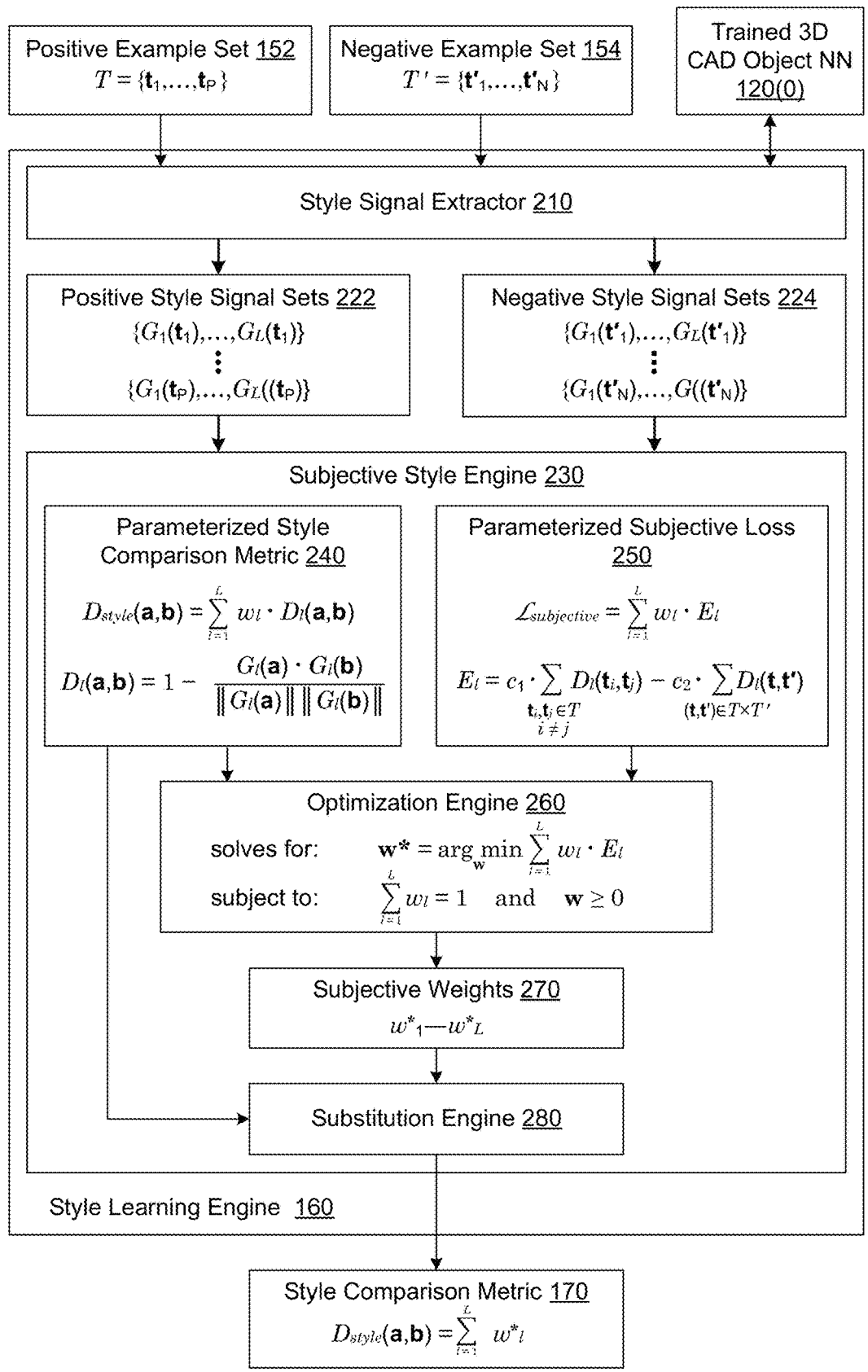
FIG. 2 is a more detailed illustration of the style learning engine of FIG. 1, according to various embodiments.

FIG. 2 is a more detailed illustration of the style learning engine 160 of FIG. 1, according to various embodiments. As shown, the style learning engine 160 uses the trained 3D CAD object neural network 120(0) to generate the style comparison metric 170 based on the positive example set 152 and the negative example set 154. For explanatory purposes, the functionality of the style learning engine 160 is depicted and described in FIG. 2 in the context of generating the style comparison metric 170 that quantifies the dissimilarity in geometric style between two 3D CAD objects. In some other embodiments, the style learning engine 160 can generate any type of style comparison metric 170, and the techniques described herein are modified accordingly.

As shown, the positive example set 152 includes, without limitation, at least two 3D CAD objects that are examples of a target style. In some embodiments, including embodiments depicted in FIG. 2, the negative example set 154 includes, without limitation, at least two counterexamples of the target style. In some other embodiments, the negative example set can include a single 3D CAD object or can be an empty set, and the functionality of the style learning engine 160 described in conjunction with FIG. 2 is modified accordingly.

In the context of FIG. 2 and for explanatory purposes, the 3D CAD objects included in the positive example set 152 are denoted herein as $t_1$-$t_P$, where P can be any integer $\geq 2$. In the context of FIG. 2 and for explanatory purposes, the 3D CAD objects included in the negative example set 154 are denoted herein as $t_1$-$t_N$, where N can be any integer $\geq 2$. The 3D CAD objects included in the positive example set 152 and the negative example set 154 can be represented in any technically feasible fashion.

As shown, the style learning engine 160 includes, without limitation, a style signal extractor 210, positive style signal sets 222, negative style signal sets 224, and a subjective style engine 230. In some embodiments, the style learning engine 160 executes any number of instances of the style signal extractor 210 any number of times to generate the positive style signal sets 222 based on the positive example set 152 and the negative style signal sets 224 based on the negative example set 154. The positive style signal set 222 includes, without limitation, a different style signal set for each of the 3D CAD objects included in the positive example set 152. The negative style signal set 224 includes, without limitation, a different style signal set for each of the 3D CAD objects included in the negative example set 154.

The style signal extractor 210 can generate a style signal set for a 3D CAD object in any technically feasible fashion. As described in greater detail below in conjunction with FIG. 3, in some embodiments, the style signal extractor 210 generates input data for the trained 3D CAD object neural network 120(0) based on the 3D CAD object. In some embodiments, including embodiments depicted in FIGS. 2 and 3, the style signal extractor 210 stores at least a portion of the input data as a feature map that is also referred to herein as an "input feature map." In some other embodiments, the style signal extractor 210 does not generate an input feature map, and the techniques described herein in conjunction with FIGS. 2 and 3 are modified accordingly.

Subsequently, the style signal extractor 210 executes the trained 3D CAD object neural network 120(0) on the input features to generate multiple feature maps, where each feature map corresponds to a different layer in a subset of the layers of the trained 3D CAD object neural network 120(0).

In some embodiments, the style signal extractor 210 disregards a content result set that is the output of the final layer of the trained 3D CAD object neural network 120(0) and/or any number of feature maps that are generated by the trained 3D CAD object neural network 120(0) but do not correspond to any layer in the subset of the layers.

The subset of the layers of the trained 3D CAD object neural network 120(0) can include, without limitation, any number and/or types of any layers included in the trained 3D CAD object neural network 120(0) at any level of hierarchy. If the trained 3D CAD object neural network 120(0) is a composite neural network that includes, without limitation, multiple constituent neural networks, then the subset of the layers can include, without limitation, any number and/or types of layers from trained 3D CAD object neural network 120(0) and/or any number and/or types of layers from any number of the constituent neural networks.

In some embodiments, a set of feature maps (not shown) for the 3D CAD object includes, without limitation, the associated initial feature map and the associated feature maps that correspond to the subset of the layers of the trained 3D CAD object neural network 120(0). For explanatory purposes, the feature maps included in the set of feature maps are associated with different "style layers." In some embodiments, the input feature map is associated with a style layer 1, and the feature maps generated by the trained 3D CAD object neural network 120(0) are associated with style layers 2-L, where L is >2. Accordingly, in some embodiments, the subset of the layers of the trained 3D CAD object neural network 120(0) includes, without limitation, (L-1) layers.

The style signal extractor 210 generates a different style signal for each of the feature maps included in the set of feature maps for the 3D CAD object to generate a style signal set for the 3D CAD object. In some embodiments, each style signal set includes, without limitation, a total of L different style signals, corresponding to the style layers 1-L. The style signal extractor 210 can perform any number and/or types of operations on a feature map to generate a corresponding style signal. For instance, in some embodiments, the style signal extractor 210 performs any number and/or types of masking, normalization, correlation operations, statistical operations, linear algebra operations, matrix operations, or any other type of mathematical operations on each feature map to generate a corresponding style signal.

In some embodiments, each style signal represents, without limitation, one or more aspects of stylistic information associated with the 3D CAD object. For instance, in some embodiments, each of the style signals represents second-order statistics of or correlations between the features or the activations included in the corresponding feature map. In the same or other embodiments, the style signal set provides a representation of stylistic aspects of the 3D CAD object at different scales.

In some embodiments, and as used herein in conjunction with FIGS. 2-5, the style signal corresponding to both a 3D CAD object a and a layer l is denoted as $G_l(a)$. Accordingly, in some embodiments, the positive style signal sets 222 include, without limitation, $\{G_1(t_1), \ldots, G_L(t_1)\}$-$\{G_1(t_P), \ldots, G_L(t_P)\}$. And the negative style signal sets 224 include, without limitation, $\{G_1(t'_1), \ldots, G_L(t'_1)\}$-$\{G_1(t'_N), \ldots, G_L(t'_N)\}$.

As shown, the subjective style engine 230 generates the style comparison metric 170 based on the positive style signal sets 222 and the negative style signal sets 224. To generate the style comparison metric 170, the subjective style engine 230 learns the relative importance of the style signals corresponding to different style layers based on the positive style signal sets 222 and the negative style signal sets 224. Advantageously, if the positive example set 152 reflects a target style as perceived by an individual user, then the style comparison metric 170 is individualized for the user. The subjective style engine 230 can generate the style comparison metric 170 in any technically feasible fashion.

As shown, in some embodiments the subjective style engine 230 generates the style comparison metric 170 that quantifies the style distance between two 3D CAD objects. In the same or other embodiments, the style comparison metric 170 is an equation that is used to compute a style distance between two 3D CAD objects that are also referred to herein as a "pair of 3D CAD objects." For explanatory purposes, a style distance between any two 3D CAD objects is denoted herein as $D_{style}(a, b)$, where a and b denote the two 3D CAD objects. The 3D CAD objects a and b can be represented in any technically feasible fashion that is consistent with the style signal extractor 210. For instance, in some embodiments, the 3D CAD objects a and b are B-reps. In some other embodiments, the 3D CAD objects a and b are 3D meshes. In some other embodiments, the 3D CAD objects a and b are 3D point clouds.

In some embodiments, the subjective style engine 230 includes, without limitation, a parameterized style comparison metric 240, a parameterized subjective loss 250, an optimization engine 260, subjective weights 270, and a substitution engine 280. The parameterized style comparison metric 240 defines a style comparison value (e.g., a style distance, a style similarity, etc.) between two 3D CAD objects based on style signals for the 3D CAD objects and any number and/or types of learnable parameters. The learnable parameters are also referred to herein as "weights." The parameterized style comparison metric 240 can define any type of style comparison value in any technically feasible fashion.

As shown, in some embodiments, the parameterized style comparison metric 240 expresses $D_{style}(a, b)$ as a weighted combination of layer-specific style distances corresponding to the style layers 1-L. In some embodiments, L different weights are denoted herein as $w_1$-$w_L$ and control how much each of the style layers 1-L, respectively, contribute to the style distance between 3D CAD objects a and b. In the same or other embodiments, the layer-specific style distances between 3D CAD objects a and b for the style layers 1-L are denoted as $D_1(a, b)$-$D_L(a, b)$, respectively. For a style layer variable l that ranges from 1 through L (inclusive), $D_1(a, b)$ reflects the style signals $G_l(a)$ and $G_l(b)$.

The parameterized style comparison metric 240 can define $D_{style}(a, b)$ and $D_l(a, b)$ in any technically feasible fashion. As shown, in some embodiments, the parameterized style comparison metric 240 defines $D_{style}(a, b)$ and $D_l(a, b)$ via equations (1) and (2):

$$D_{style}(a, b) = \sum_{l=1}^{L} w_l \cdot D_l(a, b) \quad (1)$$

$$D_l(a, b) = 1 - \frac{G_l(a) \cdot G_l(b)}{\|G_l(a)\| \|G_l(b)\|} \quad (2)$$

In some embodiments, the parameterized subjective loss 250 defines a subjective loss associated with the positive example set 152 and the negative example set 154. For explanatory purposes, the parameterized subjective loss 250 is denoted herein as $\mathcal{L}_{subjective}$. Notably, if the positive example set 152 reflects a target style as perceived by an individual user, then the parameterized subjective loss 250 reflects a loss or error in the parameterized style comparison metric 240 as perceived by the user. The parameterized subjective loss 250 can define the subjective loss in any technically feasible fashion that is consistent with the definition of the parameterized style comparison metric 240 (e.g., equations (1) and (2)). The parameterized subjective loss 250 is also referred to herein as a "parameterized loss."

In some embodiments, the parameterized subjective loss 250 defines the subjective loss based on the weights $w_1$-$w_L$ included in the parameterized style comparison metric 240 and layer-wise energy terms. The layer-wise energy terms are denoted as $E_1$-$E_L$ and correspond to style layers 1-L, respectively. As shown, in some embodiments, the parameterized subjective loss 250 defines the subjective loss via the following equation (3):

$$\mathcal{L}_{subjective} = \sum_{l=1}^{L} w_l \cdot E_l \quad (3)$$

The layer-wise energy terms are defined based on layer-specific style distances between combinations of the 3D CAD objects included in the positive example set 152 (T) and the negative example set 154 (T'). For each layer associated with a non-zero weight, as a layer-specific style distance between two 3D CAD objects from the positive example set 152 increases, the subjective loss increases. For each layer associated with a non-zero weight, as a layer-specific style distance between one 3D CAD object from the positive example set 152 and one 3D CAD object from the negative example set 154 increases, the subjective loss decreases.

In some embodiments, to comprehensively account for both the positive example set 152 and the negative example set 154, the layer-wise energy terms are expressed in terms of every possible pair of two 3D CAD objects from the positive example set 152 and every possible pair of one 3D CAD object from the positive example set 152 and one 3D CAD object from the negative example set 154. For instance, in some embodiments, the layer-wise energy term for a style layer variable l that ranges from 1 through L (inclusive), is denoted as $E_l$ and is expressed via the following equation (4):

$$E_l = c_1 \cdot \sum_{\substack{t_i, t_j \in T \\ i \neq j}} D_l(t_i, t_j) - c_2 \cdot \sum_{\substack{(t, t') \\ \in T \times T'}} D_l(t, t') \quad (4)$$

In equation (4), $c_1$ and $c_2$ are normalization constants that can be determined in any technically feasible fashion.

The optimization engine 260 optimizes the weights $w_1$-$w_L$ included in the parameterized subjective loss 250 to generate the subjective weights 270, denoted herein as $w^*_1$-$w^*_L$. For explanatory purposes, a vector of the subjective weights 270 is also denoted herein as w. If the positive example set 152 reflects a target style as perceived by an individual user, then the subjective weights 270 can reflect the importance of different stylistic aspects as perceived by the user. The optimization engine 260 can execute any number and/or types of optimization algorithms and/or any number and/or types of optimization operations to optimize the weights included in the parameterized subjective loss 250 subject to zero or more constraints.

As shown, in some embodiments, the optimization engine 260 solves the following equation (5a) subject to the constraints (5b) and (5c) to generate the subjective weights 270:

$$w\mathrel{*}= \arg_w \min \sum_{l=1}^{L} w_l \cdot E_l \qquad (5a)$$

$$\sum_{l=1}^{L} w_l = 1 \qquad (5b)$$

$$w \geq 0 \qquad (5c)$$

In some embodiments, the optimization engine 260 enforces the constraints (5b) and (5c) to prevent trivial solutions. In the same or other embodiments, if the optimization engine 260 enforces the constraints (5b) and (5c), then the layer-wise energy terms $E_1$-$E_L$ can be sufficiently determined based on the positive example set 152 irrespective of whether the negative example set 154 includes any 3D CAD objects. In the same or other embodiments, the negative example set 154 is the empty set and the second term of equation (4) is omitted. In some other embodiments, and as described previously herein in conjunction with FIG. 1, the example engine 140 of FIG. 1 randomly draws one or more negative examples from the 3D CAD object database 108(0) to reduce the risk of the optimization engine 260 over-fitting when optimizing the weights $w_1$-$w_L$.

The optimization engine 260 can solve equation (5a) subject to the constraints (5b) and (5c) in any technically feasible fashion. In some embodiments, because $E_l$ is constant with respect to w, equation (5a) is a linear combination and therefore the intersection of equation (5a) with a hyperplane corresponding to equation (5b) results in a twice-differentiable convex optimization that the optimization engine 260 solves using sequential least-squares quadratic programming.

The substitution engine 280 sets the weights $w_1$-$w_L$ included in the parameterized style comparison metric 240 equal to the subjective weights 270 $w{*}_1$-$w{*}_L$, respectively, and optionally performs any number and/or types of simplification operations on the parameterized style comparison metric 240 to generate the style comparison metric 170. For example, in some embodiments, if the optimization engine 260 determines that w*=[0,0,0,1,0,0,0]r, then the optimization engine 260 could determine that $D_{style}$(a, b)=$D_4$(a, b).

Figure 3:
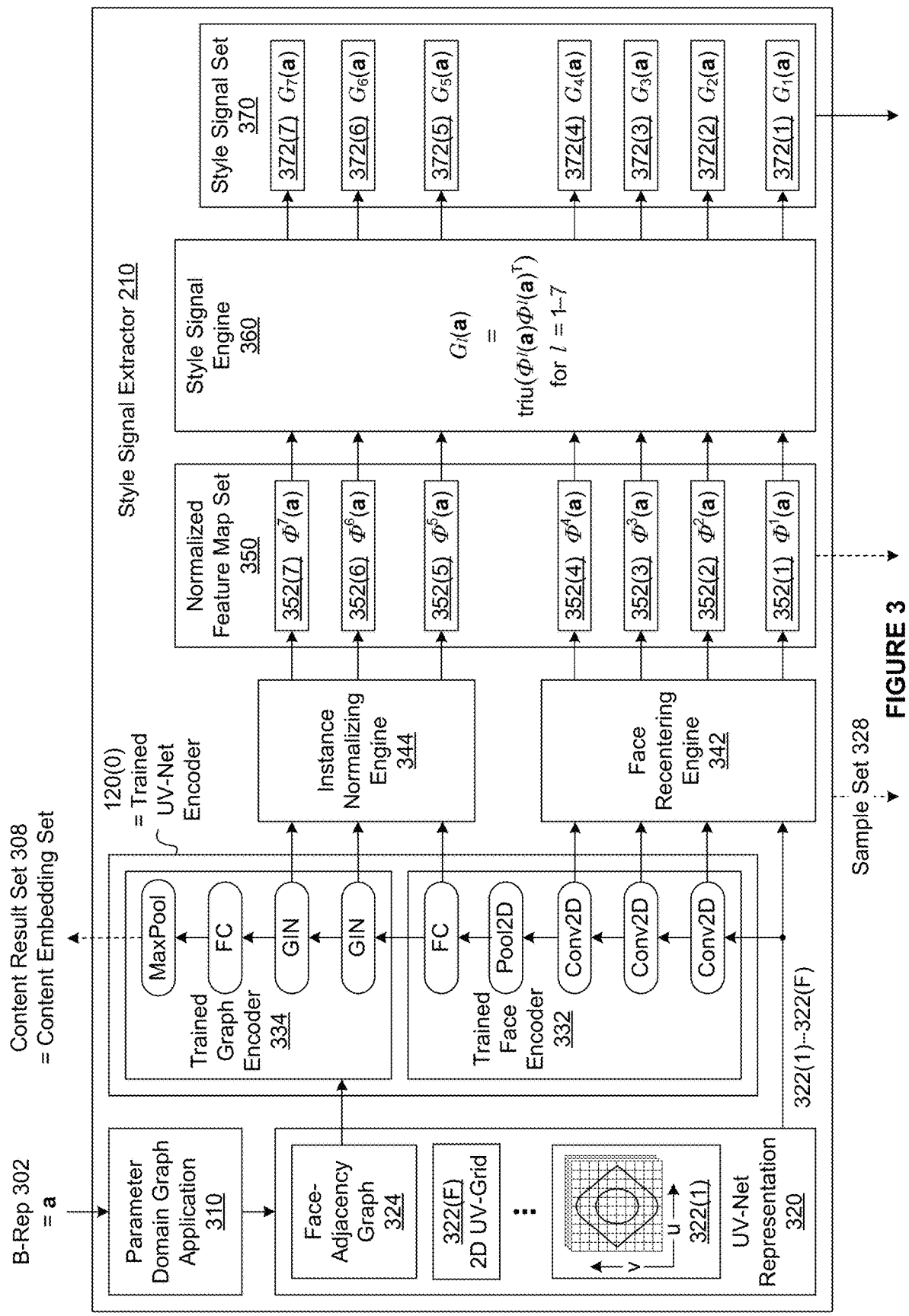
FIG. 3 is a more detailed illustration of the style signal extractor of FIG. 2, according to various embodiments.

FIG. 3 is a more detailed illustration of the style signal extractor 210 of FIG. 2, according to various embodiments. As described previously herein in conjunction with FIG. 2, in some embodiments, the style learning engine 160 executes any number of instances of the style signal extractor 210 any number of times to generate the positive style signal sets 222 based on the positive example set 152 and the negative style signal sets 224 based on the negative example set 154. In the same or other embodiments, the style comparison application 180 executes any number of instances of the style signal extractor 210 any number of times to generate a different style signal set for each of at least two 3D CAD objects. The style comparison application 180, according to some embodiments, is described in greater detail below in conjunction with FIG. 4.

In some embodiments, the style signal extractor 210 can generate a different style signal set for each of any number of 3D CAD objects. Each of the 3D CAD objects can be represented in any technically feasible fashion. For instance, in some embodiments, each 3D CAD object is a B-rep. In some other embodiments, each 3D CAD object is a 3D mesh. In some other embodiments, each 3D CAD object is a 3D point cloud.

As described previously herein in conjunction with FIG. 2, in some embodiments, to generate a style signal set for a 3D CAD object, the style signal extractor 210 executes the trained 3D CAD object neural network 120(0) to map the 3D CAD object to (L-1) feature maps. In the same or other embodiments, to generate style signal sets for multiple 3D CAD objects, the style signal extractor 210 executes any number of instances of the trained 3D CAD object neural network 120 any number of times to map each of the 3D CAD objects to (L-1) feature maps.

The trained 3D CAD object neural network 120(0) can be any type of neural network that processes each of any number and/or types of 3D CAD object to generate any number and/or types of corresponding content result sets in any technically feasible fashion. In some embodiments, the trained 3D CAD object neural network can be any type of trained encoder or any type of trained classifier. For instance, in some embodiments, the trained 3D CAD object neural network 120(0) can be a trained B-rep encoder or a trained UV-net encoder that generates a content embedding set corresponding to a B-rep. In some other embodiments, the trained 3D CAD object neural network 120(0) can be any type of trained 3D CAD object encoder that generates a content embedding set corresponding to a 3D mesh or a 3D point cloud. In some other embodiments, the trained 3D CAD object neural network 120(0) can be any type of trained 3D CAD object classifier that generates a content classification corresponding to a B-rep, a 3D mesh, a 3D point cloud, or any other technically feasible representation of a 3D CAD object. In some embodiments, the trained 3D CAD object neural network can be a composite neural network that includes, without limitation, multiple constituent neural networks.

For explanatory purposes only, FIG. 3 depicts and describes the functionality of the style signal extractor 210 in the context of some embodiments in which each 3D CAD object is a B-rep, the trained 3D CAD object neural network 120(0) is a trained UV-net encoder, and the style signal extractor 210 executes a single instance of the trained UV-net encoder a single time to map a B-rep 302 denoted as a to six feature maps. In some embodiments, the trained UV-net encoder is pre-trained using unsupervised learning techniques, which do not require labeled training data. Accordingly, unlike prior-art approaches, the disclosed techniques can be used to compare the geometric styles of pairs of different 3D CAD objects represented by B-reps, thereby increasing the accuracy of geometric style comparisons relative to the prior art.

As shown, in some embodiments, the style signal extractor 210 includes, without limitation, a parameter domain graph application 310, a UV-net representation 320, the trained 3D CAD object neural network 120(0) that is an instance of a UV-net encoder, a face recentering engine 342, an instance normalizing engine 344, a normalized feature map set 350, a style signal engine 360, and a style signal set 370. For explanatory purposes, the trained 3D CAD object neural network 120(0) is depicted as part of the style signal extractor 210. In some embodiments, the trained 3D CAD object neural network 120(0) is integrated into the style signal extractor 210 in any technically feasible fashion. In some other embodiments, the trained 3D CAD object neural network 120(0) is a stand-alone application. In the same or other embodiments, the style signal extractor 210 and the trained 3D CAD object neural network 120(0) can interact in any technically feasible fashion.

In some embodiments, the parameter domain graph application 310 converts the B-rep 302a to the UV-net representation 320. The UV-net representation 320 describes salient aspects of the 3D CAD object represented by the B-rep 302a. The UV-net representation 320 includes, without limitation, a face-adjacency graph 324, two-dimensional (2D) UV-grids 322(1)-322(F) (where F can be any positive integer), and optionally one-dimensional (1D) UV-grids. The 2D UV-grids 322(1)-322(F) are node attributes of the face-adjacency graph 324. Any 1D UV-grids are edge attributes of the face-adjacency graph 324. For explanatory purposes, no 1D UV-grids are depicted in FIG. 3 and any corresponding portions of the UV-net encoder are neither depicted in FIG. 3 nor described in conjunction with FIG. 3.

In some embodiments, each 2D UV-grid is a regular 2D grid of samples, where each sample corresponds to a grid point in the parameter domain of an associated parametric surface and has an attached set of surface features. As shown, in some embodiments, each 2D UV-grid is a 10-by-10 UV-grid of samples. In the same or other embodiments, each set of sample features includes, without limitation, a 3D point position in the geometry domain, optionally a 3D surface normal, and a visibility flag.

In some embodiments, each 3D point position is a set of three values (e.g., xyz) that specifies 3D absolute point coordinates in the geometry domain. In the same or other embodiments, each 3D surface normal is a set of three values that specifies a 3D absolute surface normal. In some embodiments, each visibility flag is either zero or one. If a given sample is in the visible region of the corresponding surface, then the parameter domain graph application 310 sets the visibility flag corresponding to the sample to one. Otherwise, the parameter domain graph application 310 sets the visibility flag corresponding to the sample to zero. The visibility flag is also referred to herein as a "trimming mask."

In the same or other embodiments, in the context of the trained UV-net encoder, the number of input channels is equal to the number of values included in each surface feature set. Accordingly, in some embodiments, each of the 2D UV-grids 322(1)-322(F) specifies values at one hundred grid points in an associated parameter domain for each of seven channels.

As shown, in some embodiments, the style signal extractor 210 generates a feature set corresponding to a style layer 1 or "input feature set" based on the 2D UV-grids 322(1)-322(F). The style signal extractor 210 can generate the input feature set in any technically feasible fashion. In the same or other embodiments, the style signal extractor 210 inputs, without limitation, the two-dimensional (2D) UV-grids 322(1)-322(F) and the face-adjacency graph 324 into the trained UV-net encoder. In response, the trained UV-net encoder generates, without limitation, multiple feature sets and a content result set 308. In some embodiments, the content result set 308 is a content embedding set. In some embodiments, the style signal extractor 210 disregards zero or more of the feature sets and/or the content result set 308.

As shown, in some embodiments, the trained UV-net encoder includes, without limitation, a trained face encoder 332 and a trained graph encoder 334. The trained face encoder 332 is a trained surface CNN that maps the 2D UV-grids 322(1)-322(F) to, without limitation, one or more feature sets and node feature vectors (not shown). The trained graph encoder 334 is a graph neural network that maps, without limitation, the face-adjacency graph 324 and the node feature vectors to node embeddings (not shown), a shape embedding (not shown), or both. The trained UV-net encoder outputs the node embeddings, the shape embedding, or both as the content result set 308.

As shown, in some embodiments, the trained face encoder 332 includes, without limitation, a sequence of three 2D convolutional layers that are each denoted "Conv2D," followed by a 2D pooling layer denoted "Pool2D," followed by a fully-connected layer that is denoted "FC." In some other embodiments, the number and/or types of layers in the face encoder 332 can vary, and the techniques described herein are modified accordingly. In some embodiments, each of the 2D convolutional layers generates and outputs a different feature set. For explanatory purposes, the first 2D convolutional layer outputs a feature set corresponding to a style layer 2, the second 2D convolution layer outputs a feature set corresponding to a style layer 3, the third 2D convolution layer outputs a feature set corresponding to a style layer 4, and the fully-connected layer outputs a feature set corresponding to a style layer 5 and associated node feature vectors.

As shown, in the same or other embodiments, the trained graph encoder 334 includes, without limitation, a sequence of two graph isomorphism network (GIN) layers that are each denoted "GIN", followed by a fully-connected layer that is denoted "FC," followed by a maximum pooling layer that is denoted "MaxPool." In some other embodiments, the number and/or types of layers in the trained graph encoder 334 can vary, and the techniques described herein are modified accordingly. In some embodiments, each of the GIN layers generates and outputs a different feature set. For explanatory purposes, the first GIN layer outputs a feature set corresponding to a style layer 6, and the second GIN layer outputs a feature set corresponding to a style layer 7.

In some embodiments, the face recentering engine 342 processes each of the feature maps that group samples into faces to generate corresponding normalized feature maps that are included in the normalized feature map set 350. In the same or other embodiments, the instance normalizing engine 344 processes each of the remaining feature maps to generate corresponding normalized features maps that are included in the normalized feature map set 350. In some embodiments, 3D CAD objects are represented as 3D meshes or 3D point clouds instead of B-reps. In some such embodiments, because 3D meshes or 3D point clouds do not enable feature maps to be grouped by face, the face recentering engine 342 is omitted.

For explanatory purposes, as used herein:
- $\Phi^l(a)$ denotes a normalized feature map corresponding to a 3D CAD object a
- $\Phi_{ij}^1(a)$ denotes the normalized unmasked feature of input channel i at position j in style layer 1
- $\Phi_{ij}^l(a)$ denotes the normalized activation of filter i at position j in style layer $l>1$
- $\Phi^1(a) \in \mathbb{R}^{d_l \times N_l}$, where $d_l$ and $N_l$ are the numbers of input channels excluding the trimming mask channel and non-masked samples, respectively, in style layer 1
- $\Phi_l(a) \in \mathbb{R}^{d_l \times N_l}$, where $d_l$ and $N_l$ are the numbers of distinct filters and non-masked samples, respectively, in style layer $l>1$ As shown, in some embodiments, the face recentering engine 342 processes the feature maps corresponding to the style layers 1-4 to generate normalized feature maps 352(1)-352(4) that are denoted as $\Phi_{ij}^1(a)$-$\Phi_{ij}^4(a)$, respectively. In some embodiments, the face recentering engine 342 masks samples and the associated features in the input feature map (corresponding to style layer 1) that correspond to positions that do not lie on the surface of a trimmed face as per the trimming mask. For each of the non-masked features in the input feature map and the activations in the feature maps corresponding to the style layers 2-4, the face recentering engine 342 re-centers (e.g., subtract the mean of) the UV sample points by face to generate the normalized feature maps 352(1)-352(4). In this fashion, the face recentering engine 342 performs per-face instance normalization without division by the standard deviation to generate the normalized feature maps 352(1)-352(4).

In the same or other embodiments, the instance normalizing engine 344 processes the feature maps corresponding to the style layers 5-7 to generate normalized feature maps 352(5)-352(7) that are denoted as $\Phi_{ij}^5(a)$-$\Phi_{ij}^7(a)$, respectively. Each of the feature maps corresponding to the style layers 5-7 includes, without limitation, a single vector per face. Accordingly, the instance normalizing engine 344 applies instance normalization across the feature maps corresponding to the style layers 5-7 to generate the normalized feature maps 352(5)-352(7).

In some embodiments, the style signal engine 360 generates the style signal set 370 based on the normalized feature map set 350. More specifically, for each normalized feature map $\Phi_{ij}^l(a)$, where the variable style layer l ranges from 1 through L (inclusive), the style signal engine 360 generates a style signal $G_l(a)$. As described previously herein in conjunction with FIG. 2, each style signal represents, without limitation, one or more aspects of stylistic information associated with the 3D CAD object a. In the same or other embodiments, the style signal set 370 provides a representation of stylistic aspects of the 3D CAD object at different scales. The style signal engine 360 can generate each style signal in any technically feasible fashion.

As shown, in some embodiments, for each normalized feature map included in the normalized feature map set 350, the style signal engine 360 extracts the normalized, flattened upper triangle of the Gram matrix for the normalized feature map to generate the style signal. The style signal engine 360 extracts the normalized, flattened upper triangle of the Gram matrix for a normalized feature map in any technically feasible fashion. As shown, in some embodiments, the style signal engine 360 extracts the normalized, flattened upper triangle of the Gram matrix for a normalized feature map denoted $\Phi^l(a)$ to generate a corresponding style signal denoted $G_l(a)$ via the following equation (6):

$$G_l(a) = \mathrm{triu}(\Phi^l(a)\Phi^l(a)^T) \text{ for } l=1-L \quad (6)$$

As shown, in some embodiments, the normalized feature map set 350 includes, without limitation, the normalized feature maps 352(1)-352(7) denoted as $\Phi_{ij}^1(a)$-$\Phi_{ij}^4(a)$. In the same or other embodiments, the style signal engine 360 applies equation (6) to each of the feature maps 352(1)-352(7) to generate style signals 372(1)-372(7) (denoted as $G_1(a)$-$G_7(a)$), respectively. Accordingly, the style signal set 370 includes, without limitation, the style signals 372(1)-372(7).

As persons skilled in the art will recognize, in some embodiments, the style signals 372(1)-372(7) represent second-order statistics of or correlations between the features or the activations in the normalized feature maps 352(1)-352(7). In the same or other embodiments, the style signal 372(1) models the distribution of local curvatures (e.g., flat/saddle/doubly curved), and the subsequent style signal 372(2)-352(7) model the distributions of higher-order curvatures (e.g., s-shaped), leading into correlations of patterns of the lower level features, and eventually into content.

As shown, the style signal extractor 210 outputs the style signal set 370. In some embodiments, as depicted via dashed arrows, the style signal extractor 210 outputs a sample set 328 and/or the normalized feature map set 350 in addition to the style signal set 370. In the same or other embodiments, the sample set 328 includes, without limitation, the unmasked input features included in the input feature map. As described in greater detail below in conjunction with FIG. 6, in some embodiments, instances of the sample set 328 and/or instances of the normalized feature map set 350 facilitate the visualization of style gradients.

Comparing the Styles of 3D CAD Objects

Figure 4:
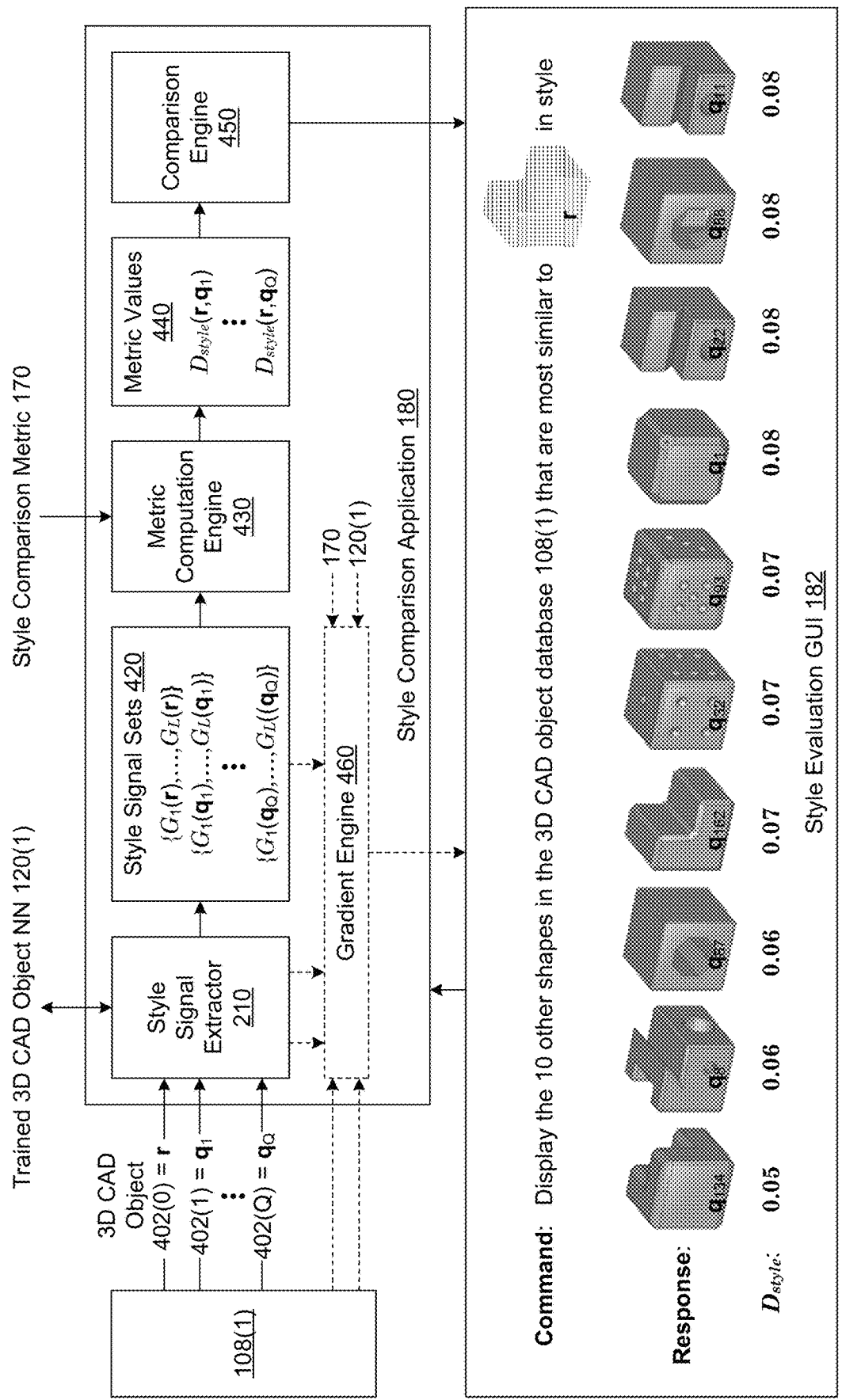
FIG. 4 is a more detailed illustration of the style comparison application of FIG. 1, according to various embodiments.

FIG. 4 is a more detailed illustration of the style comparison application 180 of FIG. 1, according to various embodiments. The style comparison application 180 can perform any number and/or types of operations to automatically evaluate styles of any number of 3D CAD objects based on applying the style comparison metric 170 to pairs of 3D CAD objects. Although not shown, in some embodiments, different instances of the style comparison application 180 can compare the same or different 3D CAD objects based on different style comparison metrics. In the same or other embodiments, different style comparison metrics can reflect different perceptions of style.

The style comparison application 180 can determine the 3D CAD objects to evaluate and the number and/or types of evaluations to perform in any technically feasible fashion. As shown, in some embodiments, the style comparison application 180 generates the style evaluation GUI 182 that enables users to specify any number and/or types of evaluations that are to be performed in any technically feasible fashion. In the same or other embodiments, the style evaluation GUI 182 enables the style comparison application 180 to display any number and/or types of evaluation results in any technically feasible fashion.

For explanatory purposes, the functionality of the style comparison application 180 is depicted in and described in conjunction with FIG. 4 in the context of responding to a command to display the ten other shapes in the 3D CAD object database 108(1) that are most similar to the 3D CAD object 402(0) in shape. In the same or other embodiments, the 3D CAD object database 108(1) includes, without limitation, the 3D CAD object 402(0) and the 3D CAD objects 402(1)-402(Q), where Q can be any positive integer. For explanatory purposes, the 3D CAD object 402(0) is also referred to herein as a "reference 3D CAD object" and is denoted as r. The 3D CAD objects 402(1)-402(Q) are also referred to herein as "query 3D CAD objects" and are denoted as $q_1$-$q_Q$, respectively.

As shown, in some embodiments, the style comparison application 180 includes, without limitation, the style signal extractor 210, style signal sets 420, a metric computation engine 430, metric values 440, and a comparison engine 450. In some embodiments, the style comparison application 180 executes any number of instances of the style signal extractor 210 any number of times to generate the style signal sets 420 corresponding to the 3D CAD objects 402(0)-402(Q). The functionality of the style signal extractor 210 was described in detail previously herein in conjunction with FIGS. 2 and 3. As shown, the style signal sets 420 include, without limitation, a different signal style set for each of the 3D CAD objects 402(0)-402(Q). More precisely, the style signal sets 420 includes, without limitation, $\{G_1(r), \ldots, G_L(r)\}$ and $\{G_1(q_1), \ldots, G_L(q_1)\}$-$\{G_1(q_Q), \ldots, G_L(q_Q)\}$.

The metric computation engine 430 applies the style comparison metric 170 to any number of style signal set pairs from the style signal sets 420 to compute corresponding metric values 440. In some embodiments, in response to the command depicted in FIG. 4, the metric computation engine 430 applies the style comparison metric 170 to compute metric values for Q pairs of 3D CAD objects, where each of the pairs includes the 3D CAD object 402(0) and a different one of the 3D CAD objects 402(1)-402(Q). More precisely, the metric computation engine 430 applies the style comparison metric 170 to pairs of signal style sets that each includes $\{G_1(r), \ldots, G_L(r)\}$ and a different one of $\{G_1(q_1), \ldots, G_L(q_1)\}$-$\{G_1(q_Q), \ldots, G_L(q_Q)\}$ to generate the metric values 440 for Q pairs of 3D CAD objects denoted $(r,q_1)$-$(r,q_Q)$.

In some embodiments, the style comparison metric 170 is $D_{style}(a,b)$ (described previously herein in conjunction with FIG. 2) and, in response to the command depicted in FIG. 4, the metric computation engine 430 computes the metric values 440 denoted $D_{style}(r,q_1)$-$D_{style}(r,q_Q)$. The metric values 440 denoted $D_{style}(r,q_Q)$-$D_{style}(r,q_Q)$ quantify the distances in geometric style between the 3D CAD object 402(0) (denoted r) and each of the 3D CAD objects 402(1)-402(Q) (denoted $q_1$-$q_Q$), respectively.

The comparison engine 450 can perform any number and/or types of ranking operations, statistical operations, filtering operations, any other type of mathematical operations, plotting operations, any other type of graphical operations, or any combination thereof on any number of the metric values 440 and optionally any number of previously generated metric values to generate any number and/or types of evaluation results (not shown).

In some embodiments, in response to the command depicted in FIG. 4, the comparison engine 450 ranks the 3D CAD objects 402(1)-402(Q) based on the metric values 440 denoted $(r,q_1)$-$(r,q_Q)$, respectively, to determine a ranked list of the 3D CAD objects 402(1)-402(Q). Based on the ranked list, the comparison engine 450 generates evaluation results specifying the ten of the 3D CAD objects 402(1)-402(Q) having geometric styles that are most similar to the geometric style of the 3D CAD object 402(0). For instance, in some embodiments, if the metric values 440 quantify the distances in geometric style between the 3D CAD object 402(0) and the 3D CAD objects 402(1)-402(Q), then the comparison engine 450 generates an evaluation result specifying, without limitation, the ten lowest of the metric values 440 and the corresponding subset of the 3D CAD objects 402(1)-402(Q).

In some embodiments, the style comparison application 180 can display any number and/or type of evaluation results via the style evaluation GUI 182, store any number and/or types of evaluation results in any memory, transmit any number and/or types of evaluation results to any number and/or types of software applications, or any combination thereof.

In some embodiments, in response to the command depicted in FIG. 4, the style comparison application 180 generates a response that, when displayed, graphically depicts the evaluation result corresponding to the command. The style comparison application 180 then displays the response via the style evaluation GUI 182. In some embodiments, the displayed response graphically depicts the subset of the metric values 440 and the corresponding subset of the 3D CAD objects 402(1)-402(Q) that are specified in the evaluation result.

For explanatory purposes, the style evaluation GUI 182 in FIG. 4 depicts an exemplary response that includes, without limitation, the ten lowest of the metric values 440 for the style comparison metric 170 of $D_{style}(a,b)$ and the corresponding subset of the 3D CAD objects 402(1)-402(Q). In the exemplary response, the ten lowest of the metric values 440 are $D_{style}(r,q_{134})$ of 0.05, $D_{style}(r,q_8)$ of 0.06, $D_{style}(r,q_{87})$ of 0.06, $D_{style}(r,q_{162})$ of 0.07, $D_{style}(r,q_{32})$ of 0.07, $D_{style}(r,q_{93})$ of 0.07, $D_{style}(r,q_1)$ of 0.08, $D_{style}(r,q_{22})$ of 0.08, $D_{style}(r,q_{88})$ of 0.08, and $D_{style}(r,q_{11})$ of 0.08 corresponding to the 3D CAD objects 402(134), 402(8), 402(87), 402(162), 402(32), 402(93), 402(1), 402(22), 402(88), and 402(11), respectively. Notably, for any other style comparison metric 170, the response could be different.

As depicted via a dashed box and dashed arrows, in some embodiments, the style comparison application 180 includes, without limitation, the style signal extractor 210, the style signal sets 420, a gradient engine 460, optionally the metric computation engine 430, optionally the metric values 440, and optionally the comparison engine 450. As described in greater detail below in conjunction with FIG. 5, in some embodiments, the gradient engine 460 generates one or more visualizations of at least one geometric style gradient. As shown, in the same or other embodiments, the gradient engine 460 computes geometric style gradient(s) and generates visualization(s) of the geometric style gradient(s) based on the style comparison metric 170, the trained 3D CAD object neural network 120(1), sample sets, normalized feature map sets, style signal sets, and 3D CAD objects. In some other embodiments, the gradient engine 460 can compute geometric style gradient(s) and generate visualization(s) of the geometric style gradient(s) based on any amount and/or types of relevant data.

Generating Visualizations of Style Differences
Between 3D Objects

Figure 5:
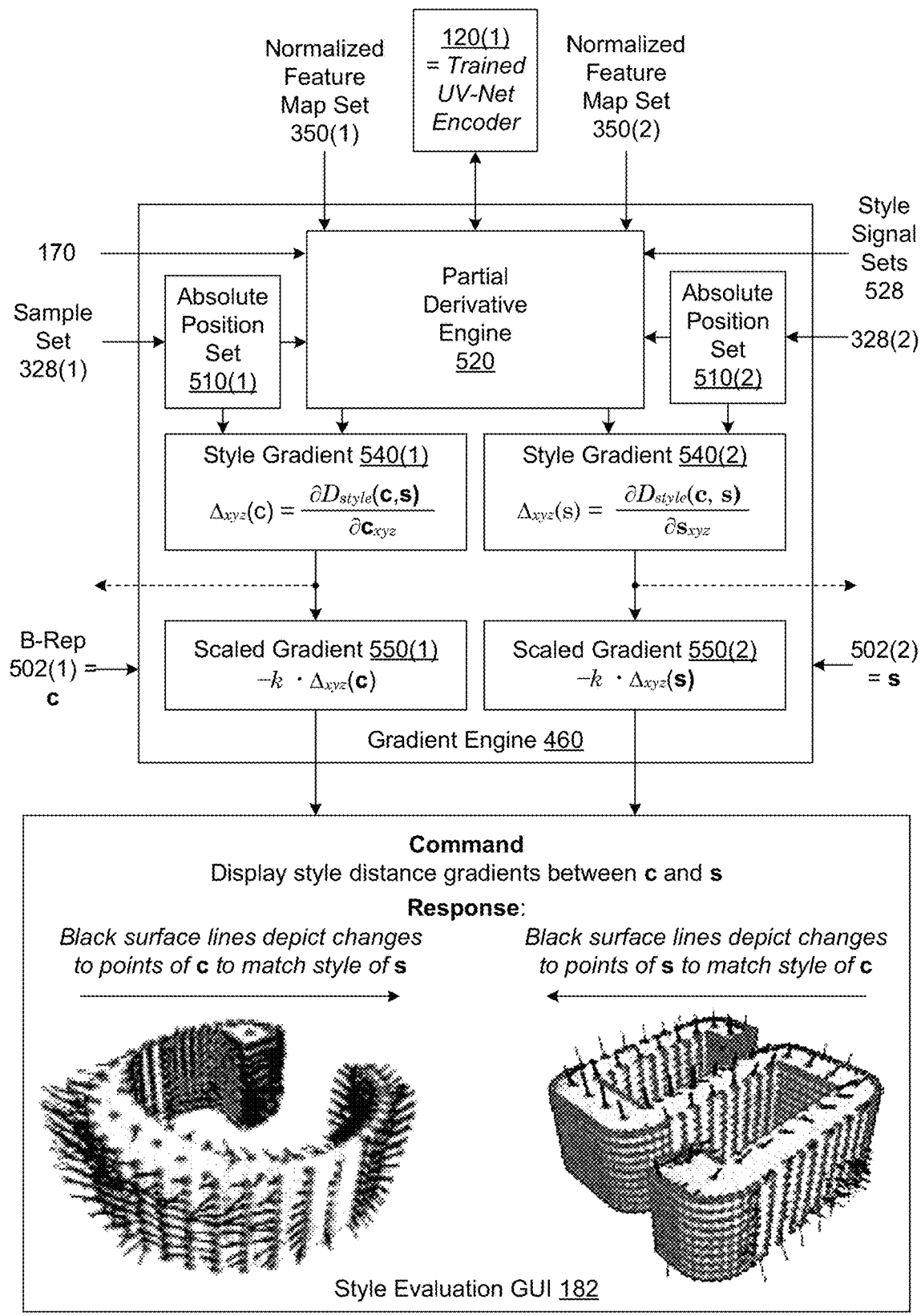
FIG. 5 is a more detailed illustration of the gradient engine of FIG. 4, according to various embodiments.

FIG. 5 is a more detailed illustration of the gradient engine 460 of FIG. 4, according to various embodiments. For each of any number of pairs of 3D CAD objects, the gradient engine 460 can compute a gradient of the style comparison metric 170 between the pair of 3D CAD objects with respect to one of the 3D CAD objects in the pair and optionally a gradient of the style comparison metric 170 between the pair of the 3D CAD objects with respect to the other 3D CAD object in the pair. The 3D CAD objects can be represented in any technically feasible fashion that is consistent with style comparison metric 170 and the trained 3D CAD object neural network 120(1).

A gradient of the style comparison metric 170 is also referred to herein as a "style gradient" and a "geometric style gradient." Although not shown, in some embodiments, different instances of the style comparison application 180 can generate style gradients based on different style comparison metrics. In the same or other embodiments, different style comparison metrics can reflect different perceptions of style. In some embodiments, the gradient engine 460 and/or the style comparison application 180 generates any number and/or types of visualizations of any number of style gradients in any technically feasible fashion (e.g., via the style evaluation GUI 182).

The style comparison application 180 can determine the style gradients that are to be computed and/or visualized in any technically feasible fashion. As described previously herein in conjunction with FIG. 4, in some embodiments, the style comparison application 180 generates the style evaluation GUI 182. In some embodiments, the style comparison application 180 enables users to specify, in any technically feasible fashion and without limitation, any number and/or types of style gradients that are to be computed and any number and/or types of visualizations of style gradients that are to be displayed. In the same or other embodiments, the style evaluation GUI 182 enables, in any technically feasible fashion and without limitation, the style comparison application 180 and/or gradient engine 460 to display any number and/or types of evaluation results derived from any number and/or types of style gradients, including visualizations of style gradients.

For explanatory purposes, FIG. 5 depicts and describes the functionality of the gradient engine 460 in the context of some embodiments in which the gradient engine 460 responds to a command to display style distance gradients associated with a trained UV-net encoder between a B-rep 502(1) denoted as c and a B-rep 502(2) denoted as s. In some embodiments, in response to the command depicted in FIG. 5, the gradient engine 460 computes a style gradient 540(1) denoted $\Delta_{xyz}(c)$ and a style gradient 540(2) denoted $\Delta_{xyz}(s)$. The gradient engine 460 then displays corresponding visualizations via the style evaluation GUI 182.

In some embodiments, the gradient engine 460 computes any number of style gradients and displays any number of visualizations for any number and/or types of style comparison metrics corresponding to any number and/or types of trained 3D CAD object neural networks and any number of pairs of 3D CAD objects that can be represented in any technically feasible fashion, and the techniques described herein are modified accordingly.

As shown, in some embodiments, the gradient engine 460 includes, without limitation, an absolute position set 510(1), an absolute position set 510(2), a partial derivative engine 520, a style gradient 540(1), a style gradient 540(2), a scaled gradient 550(1), and a scaled gradient 550(2). In some embodiments, the gradient engine 460 generates the absolute position set 510(1) and the absolute position set 510(2) based on a sample set 328(1) and a sample set 328(2), respectively. The sample set 328(1) and the sample set 328(2) are different instances of the sample set 328 that are generated by the style signal extractor 210. The sample set 328 is described previously herein in conjunction with FIG. 3.

In some embodiments, the sample set 328(1) includes, without limitation, a 3D point position in the geometry domain and optionally a 3D surface normal for each of the unmasked samples in an input feature map derived from the B-rep 502(1). The gradient engine 460 extracts the 3D point positions specified in the sample set 328(1) to generate the absolute position set 510(1). In some embodiments, the absolute position set 510(1) specifies, without limitation, an absolute 3D point position for each of the unmasked UV sample points associated with the B-rep 502(1). A 3D point position is also referred to herein as "a 3D position." The absolute positions of the UV sample points associated with the B-rep 502(1) are collectively denoted herein as $c_{xyz}$.

In the same or other embodiments, the sample set 328(2) includes, without limitation, a 3D point position in the geometry domain and optionally a 3D surface normal for each of the unmasked UV sample points in an input feature map of the B-rep 502(2). The gradient engine 460 extracts the 3D point positions specified in the sample set 328(2) to generate the absolute position set 510(2). In some embodiments, the absolute position set 510(2) specifies, without limitation, an absolute 3D point position or 3D position for each of the unmasked UV sample points associated with the B-rep 502(2). The absolute positions of the UV sample points associated with the B-rep 502(2) are collectively denoted herein as $s_{xyz}$.

As shown, in some embodiments, the partial derivative engine 520 computes the style gradient 540(1) and the style gradient 540(2). The partial derivative engine 520 can define and compute the style gradient 540(1) and the style gradient 540(2) in any technically feasible fashion. In some embodiments, the partial derivative engine 520 defines the style gradient 540(1) as a set of vectors representing a different partial derivatives of the style comparison metric 170 with respect to each 3D position included in the sample set 328(1). In the same or other embodiments, the partial derivative engine 520 defines the style gradient 540(2) as a set of vectors representing different partial derivatives of the style comparison metric 170 with respect to each 3D position included in the sample set 328(2).

As shown, in some embodiments, the style comparison metric 170 is a style distance metric that computes $D_{style}(a, b)$ for 3D CAD objects a and b, and the style gradient 540(1) and the style gradient 540(2) can be expressed as the following equations (7a) and (7b), respectively:

$$\nabla_{xyz}(c) = \frac{\delta D_{style}(c, s)}{\delta c_{xyz}} \quad (7a)$$

$$\nabla_{xyz}(s) = \frac{\delta D_{style}(c, s)}{\delta s_{xyz}} \quad (7b)$$

The partial derivative engine 520 can compute the style gradient 540(1) and the style gradient 540(2) in any technically feasible fashion. For instance, in some embodiments, the partial derivative engine 520 performs any number and/or types of backpropagation operations on the trained 3D CAD object neural network 120(1) and/or any number and/or types of analytical computations based on any amount and/or types of relevant data. In some embodiments, the relevant data can include, without limitation, the style comparison metric 170, the absolute position set 510(1), the absolute position set 510(1), style signal sets 528, normalized feature map set 350(1), normalized feature map set 350(2), or any combination thereof.

As depicted with a dashed line, in some embodiments, after the partial derivative engine 520 computes a style gradient (e.g., the style gradient 540(1) or the style gradient 540(2)), the partial derivative engine 520 and/or the style comparison application 180 can display any portion of the style gradient via the style evaluation GUI 182 in any technically feasible fashion, store any portion of the style gradient in any memory, transmit any portion of the style gradient to any number and/or types of software applications, or any combination thereof.

As shown, in some embodiments, the gradient engine 460 computes a scaled gradient 550(1) and a scaled gradient 550(2) based on the style gradient 540(1) and the style gradient 540(2), respectively. The scaled gradient 550(1) and the scaled gradient 550(2) are intended to aid in the visualization of the style gradient 540(1) and the style gradient 540(2), respectively. The gradient engine 460 can compute the scaled gradient 550(1) and the scaled gradient 550(2) in any technically feasible fashion.

As shown, in some embodiments, the style comparison metric 170 is a style distance metric and the gradient engine 460 sets the scaled gradient 550(1) equal to $-k \cdot \Delta_{xyz}(c)$ and the scaled gradient 550(2) equal to $-k \cdot \Delta_{xyz}(s)$, where $k$ is a constant scaling factor designed to increase the effectiveness of visualizations of the scaled gradient 550(1) and the scaled gradient 550(2). Notably, in some embodiments, the direction of the vectors included in the scaled gradient 550(1) and the scaled gradient 550(2) indicate the directions in which the corresponding UV sample points could be moved in the geometry domain to increase the similarity of the geometric styles of the B-rep 502(1) and the B-rep 502(2). In the same or other embodiments, the magnitude of the vectors included in the scaled gradient 550(1) and the scaled gradient 550(2) indicate relative magnitudes of the geometric style dissimilarities between the B-rep 502(1) and the B-rep 502(2).

In some embodiments, after the partial derivative engine 520 computes a scaled gradient (e.g., the scaled gradient 550(1) or the scaled gradient 550(2)), the gradient engine 460 and/or the style comparison application 180 can generate any number and/or types of visualizations based on any portion of the scaled gradient, store any portion of the scaled gradient in any memory, transmit any portion of the scaled gradient to any number and/or types of software applications, or any combination thereof.

As shown, in some embodiments, the gradient engine 460 generates any number and/or types of graphical elements (e.g., arrows, lines, etc.) based on at least one of the directions or the magnitudes of one or more of the vectors included in the scaled gradient 550(1). In some embodiments, as part of a response to the command depicted in FIG. 5, the gradient engine 460 positions each of the graphical elements relative to a graphical representation of the B-rep 502(1) within the style evaluation GUI 182 to generate a visualization of the style gradient 540(1).

As shown, in some embodiments, the graphical elements are black lines, and the gradient engine 460 positions the vectors $-k \cdot \Delta_{xyz}(c)$ that are included in the scaled gradient 550(1) centered at the absolute positions of the UV sample points associated with the B-rep 502(1). Accordingly, in the style evaluation GUI 182 displayed in FIG. 5, the black lines pointing outwards from the B-rep 502(1) show the directions in which to move the corresponding points to increase the geometric style similarity between the B-rep 502(1) and the B-rep 502(2).

In the same or other embodiments, the gradient engine 460 generates any number and/or types of graphical elements (e.g., arrows, lines, etc.) based on at least one of the directions or the magnitudes of one or more of the vectors included in the scaled gradient 550(2). The gradient engine 460 then positions each of the graphical elements relative to a graphical representation of the B-rep 502(2) within the style evaluation GUI 182 to generate a visualization of the style gradient 540(2). In some embodiments, as part of a response to the command depicted in FIG. 5, the gradient engine 460 positions each of the graphical elements relative to a graphical representation of the B-rep 502(2) within the style evaluation GUI 182 to generate a visualization of the style gradient 540(1).

As shown, in some embodiments, the graphical elements are black lines, and the gradient engine 460 positions the vectors $-k \cdot \Delta_{xyz}(s)$ that are included in the scaled gradient 550(2) centered at the absolute positions of the UV sample points associated with the B-rep 502(2). Accordingly, in the style evaluation GUI 182 displayed in FIG. 5, the black line pointing outwards from the B-rep 502(2) show the directions in which to move the corresponding points to increase the geometric style similarity between the B-rep 502(2) and the B-rep 502(1).

Figure 6:
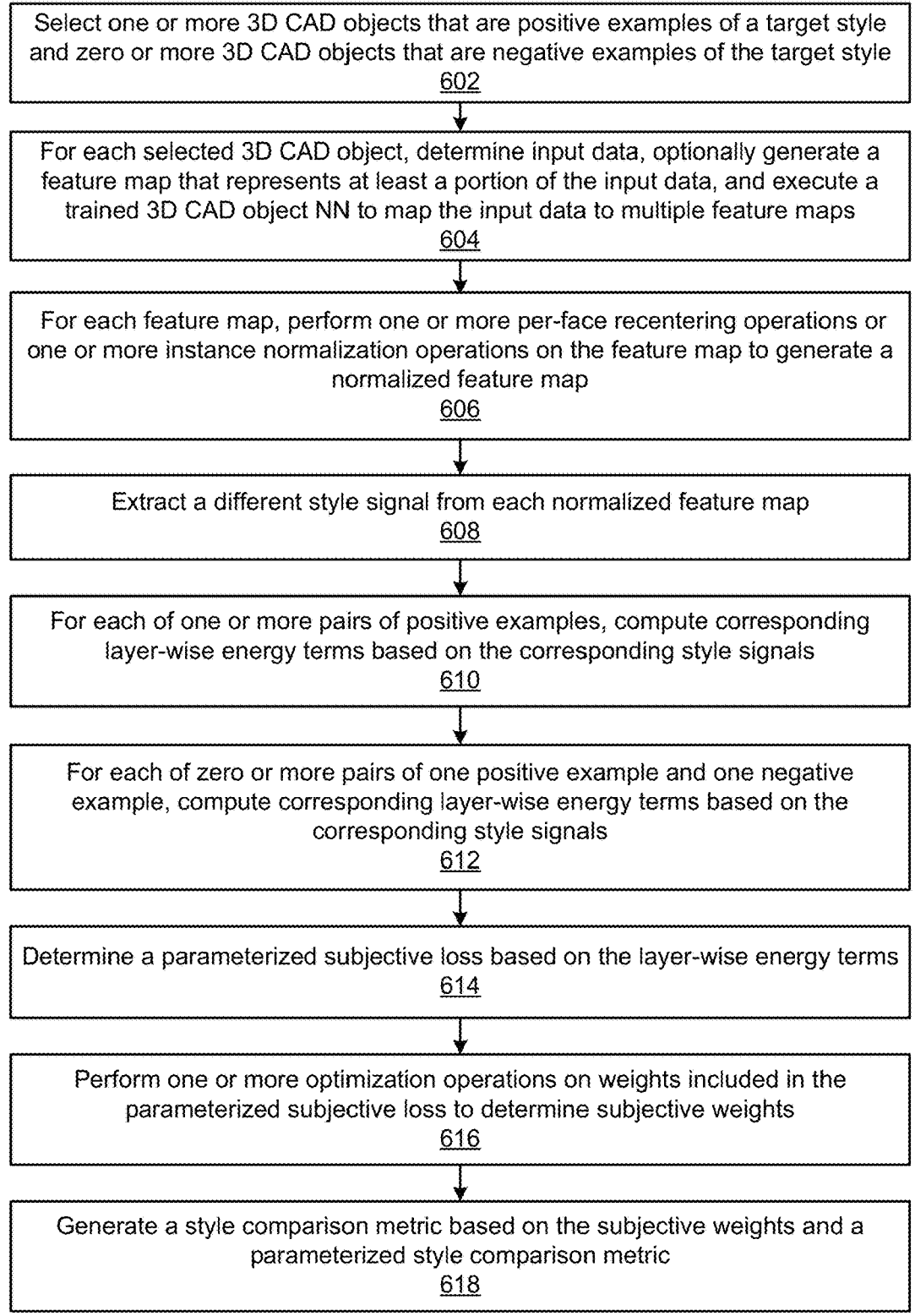
FIG. 6 is a flow diagram of method steps for generating a style comparison metric for pairs of different 3D CAD objects, according to various embodiments.

FIG. 6 is a flow diagram of method steps for generating a style comparison metric for pairs of different 3D CAD objects, according to various embodiments. Although the method steps are described with reference to the systems of FIGS. 1-5, persons skilled in the art will understand that any system configured to implement the method steps, in any order, falls within the scope of the present invention.

As shown, a method 600 begins at step 602, where the style learning engine 160 selects one or more 3D CAD objects that are positive examples of a target style and zero or more 3D CAD objects that are negative examples of the target style. At step 604, for each selected 3D CAD object, the style signal extractor 210 determines input data, optionally generates a feature map that represents at least a portion of the input data, and executes a trained 3D CAD object neural network 120(0) to map the input data to multiple feature maps.

At step 606, for each feature map, the style signal extractor 210 performs one or more per-face recentering operations or one or more instance normalization operations on the feature map to generate a normalized feature map. At step 608, the style signal extractor 210 extracts a different style signal from each normalized feature map. At step 610, for each of one or more pairs of positive examples, the subjective style engine 230 computes corresponding layer-wise energy terms based on the corresponding style signals. At step 612, for each of zero or more pairs of one positive example and one negative example, the subjective style engine 230 computes corresponding layer-wise energy terms based on the corresponding style signals.

At step 614, the subjective style engine 230 determines a parameterized subjective loss 250 based on the layer-wise energy terms. At step 616, the optimization engine 260 performs one or more optimization operations on weights included in the parameterized subjective loss to determine subjective weights 270. Subjective weights 270 are also referred to herein as "values for the weights." At step 618, the subjective style engine 230 generates the style comparison metric 170 based on the subjective weights 270 and parameterized style comparison metric 240. The method 600 then terminates.

Figure 7:
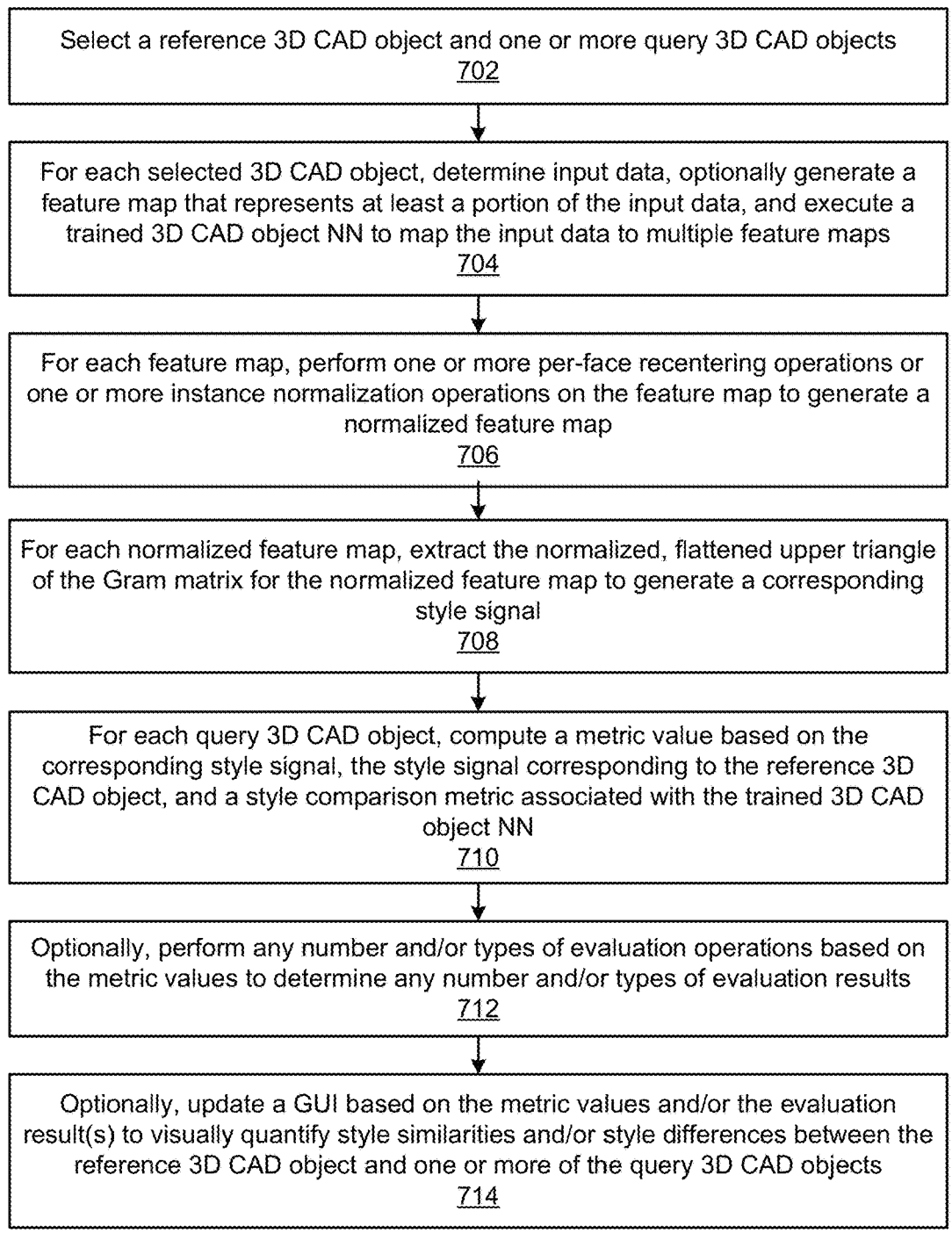
FIG. 7 is a flow diagram of method steps for comparing the geometric styles of different 3D CAD objects, according to various embodiments.

FIG. 7 is a flow diagram of method steps for comparing the geometric styles of different 3D CAD objects, according to various embodiments. Although the method steps are described with reference to the systems of FIGS. 1-5, persons skilled in the art will understand that any system configured to implement the method steps, in any order, falls within the scope of the present invention.

As shown, a method 700 begins at step 702, where the style comparison application 180 selects a reference 3D CAD object and one or more query 3D CAD objects, At step 704, for each selected 3D CAD object, the style signal extractor 210 determines input data, optionally generates a feature map that represents at least a portion of the input data, and executes the trained 3D CAD object neural network 120(1) to map the input data to multiple feature maps.

At step 706, for each feature map, the style signal extractor 210 performs one or more per-face recentering operations or one or more instance normalization operations on the feature map to generate a normalized feature map. At step 708, the style signal extractor 210 extracts a different style signal from each normalized feature map. At step 710, for each query 3D CAD object, the metric computation engine 430 computes a metric value based on the corresponding style signal, the style signal corresponding to the reference 3D CAD object, and the style comparison metric 170 associated with the trained 3D CAD object neural network 120(1).

At step 712, the comparison engine 450 optionally performs any number and/or types of evaluation operations based on the metric values to determine any number and/or types of evaluation results. At step 714, the comparison engine 450 and/or the style comparison application 180 optionally update a GUI based on the metric values and/or the evaluation result(s) to visually quantify style similarities and/or style differences between the reference 3D CAD object and one or more of the query 3D CAD objects. The method 700 then terminates.

FIG. 8 is a flow diagram of method steps for generating one or more visualizations of at least one geometric style gradient for a pair of different 3D CAD objects, according to various embodiments. Although the method steps are described with reference to the systems of FIGS. 1-5, persons skilled in the art will understand that any system configured to implement the method steps, in any order, falls within the scope of the present invention.

As shown, a method 800 begins at step 802, where the gradient engine 460 receives a command to compute gradient(s) of the style comparison metric 170 for two 3D CAD objects with respect to at least the first 3D CAD object. At step 804, the gradient engine 460 uses the trained 3D CAD object neural network 120(1) that is associated with the style comparison metric 170 to generate a set of feature maps corresponding to samples of the first 3D CAD object. At step 806, the gradient engine 460 uses the trained 3D CAD object neural network 120(1) that is associated with the style comparison metric 170 to generate a set of feature maps corresponding to samples of the second 3D CAD object At step 808, for each feature map, the style signal extractor 210 performs one or more per-face recentering operations or one or more instance normalization operations on the feature map to generate a normalized feature map. At step 808, the style signal extractor 210 extracts a different style signal from each normalized feature map. At step 810, for each query 3D CAD object, the metric computation engine 430 computes a metric value based on the corresponding style signal, the style signal corresponding to the reference 3D CAD object, and the style comparison metric 170 associated with the trained 3D CAD object neural network 120(1).

At step 812, for each normalized feature map, the gradient engine 460 extracts the normalized, flattened upper triangle of the Gram matrix for the normalized feature map to generate a corresponding style signal. At step 814, the gradient engine 460 computes the partial derivative of the style comparison metric 170 with respect to the absolute position of each unmasked sample of the first 3D CAD object to generate a first style gradient. At step 816, the gradient engine 460 optionally computes the partial derivative of the style comparison metric 170 with respect to the absolute position of each unmasked sample of the second 3D CAD object to generate a second style gradient. At step 816, the gradient engine 460 updates a GUI to display a visualization of the first style gradient with respect to the first 3D CAD object and optionally display a visualization of the second style gradient with respect to the second 3D CAD object. The 800 then terminates.

In sum, the disclosed techniques can be used to generate individualized style comparison metrics, compare the geometric style of pairs of 3D CAD objects, and generate visualizations of the gradients of style comparison metrics with respect to 3D CAD objects. In some embodiments, a training application generates a style distance metric based on at least two user-selected B-reps that are positive examples of a geometric style, zero or user-selected B-reps that are negative examples of the geometric style, and a B-rep encoder. In the same or other embodiments, to reduce the risk of over-fitting the style distance metric, the training application randomly selects additional negative examples of the geometric style from a B-rep training database. The B-rep encoder is pre-trained using unsupervised learning techniques. To generate a style distance metric for the user, the training application optimizes weights in a parameterized style distance metric that is associated with the B-rep encoder based on the positive examples and the negative examples. The subjective weights reflect the relative importance to the user of style signals associated with different layers of the B-rep encoder. Each style signal is the normalized, flattened, upper triangle of a Gram matrix that models the feature correlations for the associated layer.

In some embodiments, a style comparison application uses a style distance metric and the B-rep encoder to compute style distances between a reference B-rep and any number of query B-reps. For each of the B-reps, the style comparison application uses the B-rep encoder to compute the style signals included in the style distance metric. For each query B-rep, the style comparison application uses the style distance metric to compute the style distance between the reference B-rep and the query B-rep based on the style signals for the reference B-rep and the query B-rep. The style comparison application performs any number and/or types of filtering, ranking, any other comparison operations, or any combination thereof on the query B-reps based on the corresponding style distances. The style comparison application can visually display the results via a style evaluation GUI.

In the same or other embodiments, the style comparison application generates visualizations of the gradients of the style distance metric between two B-reps with respect to the B-reps. For each of the B-reps, the style comparison application computes the partial derivative of the style distance metric with respect to the 3D absolute position of each unmasked sample of the B-rep to generate a gradient of the style distance metric with respect to the B-rep. The style comparison application multiples the gradients by a negated constant scaling factor to generate scaled gradients that are amenable to visualization. Via the style evaluation GUI, the style comparison application superimposes each vector of each scaled gradient at the 3D absolute position of the associated B-rep to indicate the direction in which the corresponding sample point could be moved to increase the similarity of the styles of the two B-reps.

At least one technical advantage of the disclosed techniques relative to the prior art is that the disclosed techniques implement a few-shot learning approach to generate an effective individualized style comparison metric for pairs of different 3D CAD objects. In that regard, with the disclosed techniques, the relative importance of different terms in a parameterized style comparison metric to geometric style, as perceived by an individual user, can be learned using as few as two user-specified examples of 3D CAD objects having similar styles. Further, the terms in the parameterized style comparison metric can be derived from data generated by a neural network that is trained to process B-reps using unsupervised techniques, which do not require labeled training data. Accordingly, unlike prior-art approaches, the disclosed techniques can be used to compare the geometric styles of pairs of different 3D CAD objects represented by B-reps, thereby increasing the accuracy of geometric style comparisons relative to the prior art. These technical advantages provide one or more technological advancements over prior art approaches.

1. In some embodiments, a computer-implemented method for generating a style comparison metric for pairs of different three dimensional (3D) computer-aided design (CAD) objects comprises executing a trained neural network one or more times to map a plurality of 3D CAD objects to a plurality of feature maps; computing a plurality of style signals based on the plurality of feature maps; determining a plurality of values for a plurality of weights based on the plurality of style signals; and generating the style comparison metric based on the plurality of weights and a parameterized style comparison metric.

2. The computer-implemented method of clause 1 wherein a first 3D CAD object included in the plurality of 3D CAD objects comprises a positive example of a target style.

3. The computer-implemented method of clauses 1 or 2, wherein a second 3D CAD object included in the plurality of 3D CAD objects comprises a negative example of the target style.

4. The computer-implemented method of any of clauses 1-3, further comprising randomly selecting a first 3D CAD object from a data set of 3D CAD objects and including the first 3D CAD object in the plurality of 3D CAD objects; and designating the first 3D CAD object as a negative example of a target style.

5. The computer-implemented method of any of clauses 1-4, wherein determining the plurality of values for the plurality of weights comprises generating a parameterized loss based on the plurality of style signals and the plurality of weights; and performing one or more optimization operations on the parameterized loss to determine the plurality of values for the plurality of weights.

6. The computer-implemented method of any of clauses 1-5, wherein computing the plurality of style signals comprises: performing one or more per-face recentering operations on a first feature map included in the plurality of feature maps to generate a first normalized feature map; and extracting at least a portion of a Gram matrix of the first normalized feature map to generate a first style signal included in the plurality of style signals.

7. The computer-implemented method of any of clauses 1-6, wherein generating the style comparison metric comprises replacing a first weight that is specified in the parameterized style comparison metric and included in the plurality of weights with a first value included in the plurality of values.

8. The computer-implemented method of any of clauses 1-7, wherein the trained neural network comprises a trained UV-net encoder, and further comprising generating a first UV-net representation based on a first B-rep that represents a first 3D CAD object included in the plurality of 3D CAD objects; and inputting the first UV-net representation into the trained UV-net encoder.

9. The computer-implemented method of any of clauses 1-8, wherein a representation of a first 3D CAD object included in the plurality of 3D CAD objects comprises a boundary-representation (B-rep), a 3D mesh, or a 3D point cloud.

10. The computer-implemented method of any of clauses 1-9, wherein the trained neural network comprises a trained encoder or a trained classifier.

11. In some embodiments, one or more non-transitory computer readable media include instructions that, when executed by one or more processors, cause the one or more processors to generate a style comparison metric for pairs of different three dimensional (3D) computer-aided design (CAD) objects by performing the steps of executing a trained neural network one or more times to map a plurality of 3D CAD objects to a plurality of feature maps; computing a plurality of style signals based on the plurality of feature maps; determining a plurality of values for a plurality of weights based on the plurality of style signals; and generating the style comparison metric based on the plurality of weights and a parameterized style comparison metric.

12. The one or more non-transitory computer readable media of clause 11, wherein a first 3D CAD object included in the plurality of 3D CAD objects comprises a user-specified positive example of a target style.

13. The one or more non-transitory computer readable media of clauses 11 or 12, wherein a second 3D CAD object included in the plurality of 3D CAD objects comprises a negative example of the target style.

14. The one or more non-transitory computer readable media of any of clauses 11-13, further comprising randomly selecting a first 3D CAD object from a data set of 3D CAD objects and including the first 3D CAD object in the plurality of 3D CAD objects; and designating the first 3D CAD object as a negative example of a target style.

15. The one or more non-transitory computer readable media of any of clauses 11-14, wherein determining the plurality of values for the plurality of weights comprises generating a parameterized loss based on the plurality of style signals and the plurality of weights; and performing one or more optimization operations on the parameterized loss to determine the plurality of values for the plurality of weights.

16. The one or more non-transitory computer readable media of any of clauses 11-15, wherein computing the plurality of style signals comprises performing one or more instance normalization operations on a first feature map included in the plurality of feature maps to generate a first normalized feature map; and extracting at least a portion of a Gram matrix of the first normalized feature map to generate a first style signal included in the plurality of style signals.

17. The one or more non-transitory computer readable media of any of clauses 11-16, wherein generating the style comparison metric comprises replacing a first weight that is specified in the parameterized style comparison metric and included in the plurality of weights with a first value included in the plurality of values.

18. The one or more non-transitory computer readable media of any of clauses 11-17, wherein the trained neural network includes a trained face encoder and a trained graph encoder.

19. The one or more non-transitory computer readable media of any of clauses 11-18, wherein a representation of a first 3D CAD object included in the plurality of 3D CAD objects comprises a boundary-representation (B-rep), a 3D mesh, or a 3D point cloud.

20. In some embodiments, a system comprises one or more memories storing instructions and one or more processors coupled to the one or more memories that, when executing the instructions, perform the steps of executing a trained neural network one or more times to map a plurality of 3D CAD objects to a plurality of feature maps; computing a plurality of style signals based on the plurality of feature maps; determining a plurality of values for a plurality of weights based on the plurality of style signals; and generating a style comparison metric based on the plurality of weights and a parameterized style comparison metric.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed.

Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the from of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general-purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for generating a style comparison metric for pairs of different three dimensional (3D) computer-aided design (CAD) objects, the method comprising:

executing a trained neural network one or more times to map inputs of the trained neural network comprising a plurality of 3D CAD objects to outputs of the trained neural network comprising a plurality of feature maps, wherein the trained neural network is generated using unsupervised learning techniques that do not receive labeled training data as input;

computing a plurality of style signals based on the plurality of feature maps;

determining a plurality of values for a plurality of weights based on the plurality of style signals, wherein a parameterized style comparison metric combines a plurality of style distances based on the plurality of weights; and generating the style comparison metric based on the plurality of weights and the parameterized style comparison metric.

2. The computer-implemented method of claim 1, wherein a first 3D CAD object included in the plurality of 3D CAD objects comprises a positive example of a target style.

3. The computer-implemented method of claim 2, wherein a second 3D CAD object included in the plurality of 3D CAD objects comprises a negative example of the target style.

4. The computer-implemented method of claim 1, further comprising:

randomly selecting a first 3D CAD object from a data set of 3D CAD objects and including the first 3D CAD object in the plurality of 3D CAD objects; and designating the first 3D CAD object as a negative example of a target style.

5. The computer-implemented method of claim 1, wherein determining the plurality of values for the plurality of weights comprises:

generating a parameterized loss based on the plurality of style signals and the plurality of weights; and performing one or more optimization operations on the parameterized loss to determine the plurality of values for the plurality of weights.

6. The computer-implemented method of claim 1, wherein computing the plurality of style signals comprises:

performing one or more per-face recentering operations on a first feature map included in the plurality of feature maps to generate a first normalized feature map; and extracting at least a portion of a Gram matrix of the first normalized feature map to generate a first style signal included in the plurality of style signals.

7. The computer-implemented method of claim 1, wherein generating the style comparison metric comprises replacing a first weight that is specified in the parameterized style comparison metric and included in the plurality of weights with a first value included in the plurality of values.

8. The computer-implemented method of claim 1, wherein the trained neural network comprises a trained encoder neural network that is configured to map boundary-representations (B-reps) of the plurality of 3D CAD objects to the plurality of feature maps, and further comprising:
generating a first representation based on a first B-rep that represents a first 3D CAD object included in the plurality of 3D CAD objects; and
inputting the first representation into the trained encoder neural network.

9. The computer-implemented method of claim 1, wherein a representation of a first 3D CAD object included in the plurality of 3D CAD objects comprises a boundary-representation (B-rep), a 3D mesh, or a 3D point cloud.

10. The computer-implemented method of claim 1, wherein the trained neural network comprises a trained encoder or a trained classifier.

11. One or more non-transitory computer readable media including instructions that, when executed by one or more processors, cause the one or more processors to generate a style comparison metric for pairs of different three dimensional (3D) computer-aided design (CAD) objects by performing the steps of:
executing a trained neural network one or more times to map inputs of the trained neural network comprising a plurality of 3D CAD objects to outputs of the trained neural network comprising a plurality of feature maps, wherein the trained neural network is generated using unsupervised learning techniques that do not receive labeled training data as input;
computing a plurality of style signals based on the plurality of feature maps;
determining a plurality of values for a plurality of weights based on the plurality of style signals, wherein a parameterized style comparison metric combines a plurality of style distances based on the plurality of weights; and
generating the style comparison metric based on the plurality of weights and the parameterized style comparison metric.

12. The one or more non-transitory computer readable media of claim 11, wherein a first 3D CAD object included in the plurality of 3D CAD objects comprises a user-specified positive example of a target style.

13. The one or more non-transitory computer readable media of claim 12, wherein a second 3D CAD object included in the plurality of 3D CAD objects comprises a negative example of the target style.

14. The one or more non-transitory computer readable media of claim 11, further comprising:
randomly selecting a first 3D CAD object from a data set of 3D CAD objects and including the first 3D CAD object in the plurality of 3D CAD objects; and
designating the first 3D CAD object as a negative example of a target style.

15. The one or more non-transitory computer readable media of claim 11, wherein determining the plurality of values for the plurality of weights comprises:
generating a parameterized loss based on the plurality of style signals and the plurality of weights; and
performing one or more optimization operations on the parameterized loss to determine the plurality of values for the plurality of weights.

16. The one or more non-transitory computer readable media of claim 11, wherein computing the plurality of style signals comprises:
performing one or more instance normalization operations on a first feature map included in the plurality of feature maps to generate a first normalized feature map; and
extracting at least a portion of a Gram matrix of the first normalized feature map to generate a first style signal included in the plurality of style signals.

17. The one or more non-transitory computer readable media of claim 11, wherein generating the style comparison metric comprises replacing a first weight that is specified in the parameterized style comparison metric and included in the plurality of weights with a first value included in the plurality of values.

18. The one or more non-transitory computer readable media of claim 11, wherein the trained neural network includes a trained face encoder and a trained graph encoder.

19. The one or more non-transitory computer readable media of claim 11, wherein a representation of a first 3D CAD object included in the plurality of 3D CAD objects comprises a boundary-representation (B-rep), a 3D mesh, or a 3D point cloud.

20. A system comprising:
one or more memories storing instructions; and
one or more processors coupled to the one or more memories that, when executing the instructions, perform the steps of:
executing a trained neural network one or more times to map inputs of the trained neural network comprising a plurality of 3D CAD objects to outputs of the trained neural network comprising a plurality of feature maps, wherein the trained neural network is generated using unsupervised learning techniques that do not receive labeled training data as input;
computing a plurality of style signals based on the plurality of feature maps;
determining a plurality of values for a plurality of weights based on the plurality of style signals, wherein a parameterized style comparison metric combines a plurality of style distances based on the plurality of weights; and
generating a style comparison metric based on the plurality of weights and the parameterized style comparison metric.

* * * * *